(12) United States Patent
Kim et al.

(10) Patent No.: US 12,204,389 B2
(45) Date of Patent: Jan. 21, 2025

(54) REGULATOR CIRCUIT, AN ELECTRONIC DEVICE INCLUDING THE REGULATOR CIRCUIT, AND A PROCESSOR INCLUDING THE REGULATOR CIRCUIT

(71) Applicant: SAMSUNG ELECTRONICS CO., LTD., Suwon-si (KR)

(72) Inventors: Insung Kim, Hwaseong-si (KR); Joomyoung Kim, Hwaseong-si (KR); Wooseok Kim, Suwon-si (KR); Taeik Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 227 days.

(21) Appl. No.: 17/394,520

(22) Filed: Aug. 5, 2021

(65) Prior Publication Data

US 2022/0107675 A1  Apr. 7, 2022

(30) Foreign Application Priority Data

Oct. 6, 2020  (KR) .................. 10-2020-0129010

(51) Int. Cl.
*G06F 1/26* (2006.01)
*G05F 1/56* (2006.01)
*G05F 1/575* (2006.01)
*G06F 1/04* (2006.01)
*H02M 3/156* (2006.01)
*H03K 3/037* (2006.01)

(52) U.S. Cl.
CPC .................. *G06F 1/26* (2013.01); *G05F 1/56* (2013.01); *G06F 1/04* (2013.01); *H03K 3/037* (2013.01); *G05F 1/575* (2013.01); *H02M 3/156* (2013.01)

(58) Field of Classification Search
CPC .......... H02M 3/156; G05F 1/56; G05F 1/575; H03K 3/037; G06F 1/26; G06F 1/04
USPC .......................... 713/300, 500; 323/280, 282
See application file for complete search history.

(56) References Cited

U.S. PATENT DOCUMENTS

| | | | |
|---|---|---|---|
| 6,259,632 B1 * | 7/2001 | Khouri | G11C 16/30 365/185.23 |
| 8,760,133 B2 | 6/2014 | Hasegawa et al. | |
| 8,816,658 B1 | 8/2014 | De Vita et al. | |
| 8,860,389 B2 | 10/2014 | Gakhar et al. | |
| 9,312,824 B2 | 4/2016 | Kuttner | |

(Continued)

FOREIGN PATENT DOCUMENTS

KR  10-2020-0004699  1/2020

*Primary Examiner* — Ji H Bae
(74) *Attorney, Agent, or Firm* — F. CHAU & ASSOCIATES, LLC

(57) ABSTRACT

An electronic device including: a regulator circuit configured to output a regulated voltage based on a reference voltage and a feedback voltage; and an oscillator configured to generate an output frequency signal based on a reference frequency signal and the regulated voltage output from the regulator circuit, wherein the regulator circuit includes: a feedback loop configured to output the regulated voltage based on a difference between the reference voltage and the feedback voltage; a first capacitor; a precharge circuit connected to the feedback loop, and configured to charge the first capacitor with a second voltage which is based on a first voltage; a first switch configured to connect the precharge circuit with the first capacitor; and a second switch configured to connect the first capacitor with the feedback loop.

11 Claims, 16 Drawing Sheets

(56) References Cited

U.S. PATENT DOCUMENTS

| | | |
|---|---|---|
| 9,448,574 B2 | 9/2016 | Motz |
| 9,552,004 B1 | 1/2017 | Dixit et al. |
| 9,671,803 B2 | 6/2017 | Oikarinen |
| 2012/0038332 A1 | 2/2012 | Lin |
| 2014/0210436 A1* | 7/2014 | Zhong .................... H02M 3/07 |
| | | 323/271 |
| 2015/0042296 A1* | 2/2015 | Cheng ................... H02M 3/158 |
| | | 323/269 |
| 2016/0226378 A1 | 8/2016 | Suzuki |
| 2019/0131870 A1* | 5/2019 | Hastings ................ G05F 1/468 |
| 2020/0012301 A1 | 1/2020 | Lee et al. |

\* cited by examiner

REGULATOR CIRCUIT, AN ELECTRONIC DEVICE INCLUDING THE REGULATOR CIRCUIT, AND A PROCESSOR INCLUDING THE REGULATOR CIRCUIT

CROSS-REFERENCE TO RELATED APPLICATION

This application claims priority under 35 U.S.C. § 119 to Korean Patent Application No. 10-2020-0129010 filed on Oct. 6, 2020, in the Korean Intellectual Property Office, the disclosure of which is incorporated by reference herein in its entirety.

TECHNICAL FIELD

Embodiments of the present disclosure described herein relate to a regulator circuit and an electronic device including the same, and more particularly, to a step-down regulator circuit, an electronic device including the step-down regulator circuit, and a processor including the step-down regulator circuit.

DISCUSSION OF THE RELATED ART

A phase locked loop (PLL) circuit generates an output signal whose phase is related to the phase of an input signal. A PLL circuit with a low jitter characteristic may include an internal regulator circuit that generates a voltage to be applied to a voltage controlled oscillator in the PLL circuit. The regulator circuit may supply a stable voltage to the voltage controlled oscillator.

A low-dropout regulator (LDO regulator) (or a step-down regulator) may be connected to an external capacitor to remove noise introduced to or generated by the regulator circuit. Alternatively, an LDO regulator may include a capacitor for adjusting a bandwidth of the LDO regulator. The internal capacitor may remove high-frequency noise of the LDO regulator. However, because the internal capacitor reduces a high-frequency bandwidth of the LDO regulator, a time taken to stabilize a voltage output from the LDO regulator may increase. Accordingly, a time needed to lock a phase of an output signal of the PLL circuit may also increase.

SUMMARY

According to an embodiment of the present disclosure, there is provided an electronic device including: a regulator circuit configured to output a regulated voltage based on a reference voltage and a feedback voltage; and an oscillator configured to generate an output frequency signal based on a reference frequency signal and the regulated voltage output from the regulator circuit, wherein the regulator circuit includes: a feedback loop configured to output the regulated voltage based on a difference between the reference voltage and the feedback voltage; a first capacitor; a precharge circuit connected to the feedback loop, and configured to charge the first capacitor with a second voltage which is based on a first voltage; a first switch configured to connect the precharge circuit with the first capacitor; and a second switch configured to connect the first capacitor with the feedback loop.

According to an embodiment of the present disclosure, there is provided a regulator circuit including: a feedback circuit connected between an output node and a ground node, and configured to output a feedback voltage; an error amplifier configured to output a first voltage by comparing the feedback voltage of the feedback circuit with a reference voltage and amplifying a difference between the feedback voltage and the reference voltage as the first voltage; a pass transistor connected between a power node for receiving a first driving voltage and the output node and including a gate connected to a first node from which the first voltage of the error amplifier is output; as precharge circuit connected to the first node, and configured to output a second voltage by using the first voltage; a first switch connected to a second node from which the second voltage of the precharge circuit is output; a second switch connected between the first node and the first switch; and a first capacitor connected between a connection node of the first switch and the second switch and the ground node, wherein the first switch and the second switch operate complementary to each other.

According to an embodiment of the present disclosure, there is provided a processor including; a clock generator including a regulator circuit configured to output a regulated voltage based on a reference voltage and a feedback voltage and an oscillator configured to generate a clock signal based on a reference frequency signal and the reference voltage; and a plurality of cores each configured to operate based on the clock signal, wherein the regulator circuit includes; a precharge circuit configured to charge a first capacitor with a second voltage by using a first voltage, in response to a first signal, wherein the second voltage is based on a difference between the reference voltage and the feedback voltage, and wherein the first capacitor is connected to a first node of the regulator circuit, from which the first voltage is output, in response to a second signal.

According to an embodiment of the present disclosure, there is provided a regulator circuit including: a feedback circuit connected to an output node and configured to output a feedback voltage; an error amplifier configured to output a first voltage by comparing the feedback voltage with a reference voltage and amplifying a difference between the feedback voltage and the reference voltage as the first voltage; a precharge circuit connected configured to output a second voltage in response the first voltage; a first switch connected to the precharge circuit; and a capacitor configured to be charged with the second voltage output from the precharge circuit when the first switch is turned on.

BRIEF DESCRIPTION OF THE FIGURES

The above and other features of the present disclosure will become apparent by describing in detail embodiments thereof with reference to the accompanying drawings.

DETAILED DESCRIPTION OF THE EMBODIMENTS

Below, embodiments of the present disclosure may be described in detail and clearly to such an extent that an ordinary one in the art can implement the present disclosure.

Hereinafter, embodiments of the present disclosure will be described in detail with reference to accompanying drawings. With regard to the description of the present disclosure, to make the overall understanding easy, similar components will be marked by similar reference signs/numerals in drawings, and thus, additional description may be omitted to avoid redundancy.

Below, a phase locked loop circuit (PLL circuit) is described in detail. Components of the phase locked loop circuit may be implemented with individual circuits, respectively. Alternatively, the components of the phase locked loop circuit may be implemented with a combination of two or more circuits. Alternatively, two or more of the components of the phase locked loop circuit may be implemented with one circuit.

Figure 1:
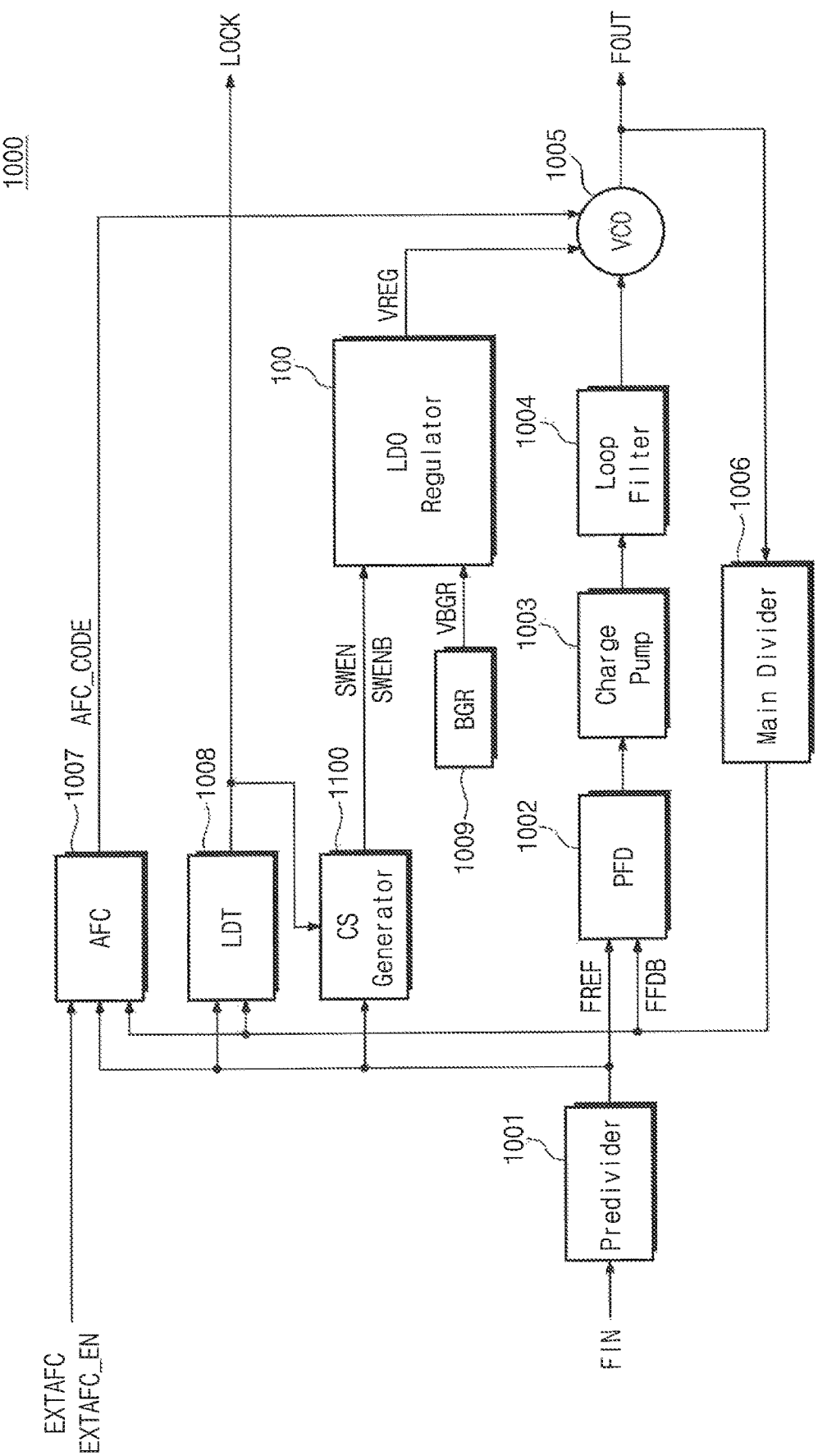
FIG. 1 is a block diagram of a phase locked loop circuit according to an embodiment of the present disclosure.

FIG. 1 is a block diagram of a phase locked loop circuit according to an embodiment of the present disclosure. Referring to FIG. 1, a phase locked loop circuit 1000 may include a predivider 1001, a phase frequency detector (PFD) (or a phase comparator) 1002, a charge pump 1003, a loop filter 1004, a voltage-controlled oscillator (VCO) 1005, a main divider 1006, an automatic frequency calibrator (AFC) 1007, a lock detector (LDT) 1008, a control signal (CS) generator 1100, a bandgap reference 1009, and a low-dropout (LDO) regulator 100. In an embodiment of the present disclosure, the phase locked loop circuit 1000 may be a low jitter phase locked loop circuit.

The predivider 1001 may receive an input frequency signal FIN from the outside of the phase locked loop circuit 1000. The predivider 1001 may venerate a reference frequency signal FREF by dividing a frequency of the input frequency signal FIN. For example, the predivider 1001 may divide the frequency of the input frequency signal FIN to make an operation of other component(s) (e.g., the voltage-controlled oscillator 1005) in the phase locked loop circuit 1000 easy. The predivider 1001 may transmit the reference frequency signal FREF to the phase frequency detector 1002, the AFC 1007, the lock detector 1008, and the control signal generator 1100.

The phase frequency detector 1002 may receive the reference frequency signal FREF from the predivider 1001. The phase frequency detector 1002 may receive a feedback frequency signal FFDB from the main divider 1006. The phase frequency detector 1002 may compare frequencies or phases of the reference frequency signal FREF and the feedback frequency signal FFDB. The phase frequency detector 1002 may transmit a signal corresponding to a comparison result to the charge pump 1003. As an example, the phase frequency detector 1002 may include a comparator circuit.

The charge pump 1003 may generate a voltage having a level corresponding to a frequency of the signal received from the phase frequency detector 1002. In other words, the voltage generated by the charge pump 1003 may correspond to a frequency of the comparison result signal output from the phase frequency detector 1002. For example, the charge pump 1003 may generate the voltage by pumping charges as much as an amount corresponding to a pulse width of the signal received from the phase frequency detector 1002. The charge pump 1003 may transmit the generated voltage to the loop filter 1004.

The loop filter 1004 may filter an output voltage of the charge pump 1003. For example, the loop filter 1004 may receive the output voltage of the charge pump 1003 and may remove a high-frequency component of the output voltage of the charge pump 1003. In other words, the loop filter 1004 may operate as a low-pass filter. A voltage filtered by the loop filter 1004 may be transmitted to the voltage-controlled oscillator 1005.

The voltage-controlled oscillator 1005 may receive the voltage from the loop filter 1004. The voltage-controlled oscillator 1005 may receive a regulated voltage VREG from the LDO regulator 100. The voltage-controlled oscillator 1005 may receive an AFC code AFC_CODE from the AFC 1007. The voltage-controlled oscillator 1005 may generate an output frequency signal FOUT based on the received voltages (e.g., the regulated voltage VREG and the voltage output from the loop filter 1004) and the received AFC code AFC_CODE. The voltage-controlled oscillator 1005 may transmit the output frequency signal FOUT to the outside of the phase locked loop circuit 1000 or may transmit the output frequency signal FOUT to the main divider 1006. In other words, the voltage-controlled oscillator 1005 may feed back the output frequency signal FOUT to the main divider 1006. In an embodiment, the voltage-controlled oscillator 1005 may be implemented with an inductor capacitor-voltage-controlled oscillator (LC-VCO).

The main divider 1006 may receive the output frequency signal FOUT from the voltage-controlled oscillator 1005. The main divider 1006 may divide a frequency of the output frequency signal FOUT by a specific division ratio. For example, the main divider 1006 may generate the feedback frequency signal FFDB by dividing the frequency of the output frequency signal FOUT by an integer of 1 or more. The main divider 1006 may transmit the feedback frequency signal FFDB to the phase frequency detector 1002, the AFC 1007, and the lock detector 1008.

The AFC 1007 may calibrate (or control) a frequency of the output frequency signal FOUT output from the voltage-controlled oscillator 1005 based on the reference frequency signal FREF received from the predivider 1001 and the feedback frequency signal FFDB received from the main divider 1006. In other words, the AFC 1007 may calibrate a frequency of the output frequency signal FOUT in response to the reference frequency signal FREF and the feedback frequency signal FFDB. For example, the AFC 1007 may receive an external AFC code EXTAFC, and an external AFC code enable signal EXTAFC_EN from the outside of the phase locked loop circuit 1000. The AFC 1007 may generate the AFC code AFC_CODE based on the reference frequency signal FREF, the feedback frequency signal FFDB, the external AFC code EXTAFC, and the external AFC code enable signal EXTAFC_EN. The frequency of the output frequency signal FOUT may be calibrated to a target frequency (or set close to the target frequency), based on the AFC code AFC_CODE.

The lock detector 1008 may determine whether a phase (or frequency) of the output frequency signal FOUT output from the phase locked loop circuit 1000 is locked, based on the reference frequency signal FREF received from the predivider 1001 and the feedback frequency signal FFDB received from the main divider 1006. For example, based on a difference between a frequency of the reference frequency signal FREF and a frequency of the feedback frequency signal FFDB, the lock detector 1008 may determine that the frequency of the output frequency signal FOUT reaches the target frequency. In this case, the lock detector 1008 may determine that a phase of the output frequency signal FOUT is locked. The lock detector 1008 may generate a lock signal LOCK based on a determination result. The lock detector 1008 may transmit the lock signal LOCK to the control signal generator 1100 and the outside of the phase locked loop circuit 1000.

The control signal generator 1100 may receive the reference frequency signal FREF from the predivider 1001. The control signal generator 1100 may receive the lock signal LOCK from the lock detector 1008. The control signal generator 1100 may generate a switch signal SWEN and a complementary switch signal SWENB based on at least one of the reference frequency signal FREF and the lock signal LOCK. In an embodiment of the present disclosure, the complementary switch signal SWENB may be complementary to the switch signal. The control signal generator 1100 may transmit the switch signal SWEN and the complementary switch signal SWENB to the LDO regulator 100. The control signal generator 1100 will be described with reference to FIG. 6 in detail.

The BGR 1009 may supply a reference voltage VBGR to the LDO regulator 100. For example, the BGR 1009 may be supplied with a voltage from the outside of the phase locked loop circuit 1000. The BGR 1009 may generate the reference voltage VBGR based on the supplied voltage.

The LDO regulator 100 may generate the regulated voltage VREG. For example, the LDO regulator 100 may generate the regulated voltage VREG based on the switch signal SWEN and the complementary switch signal SWENB received from the control signal generator 1100 and the reference voltage VBGR received from the BGR 1009. The LDO regulator 100 may transmit the regulated voltage VREG to the voltage-controlled oscillator 1005. The LDO regulator 100 will be described later in detail.

Figure 2A:
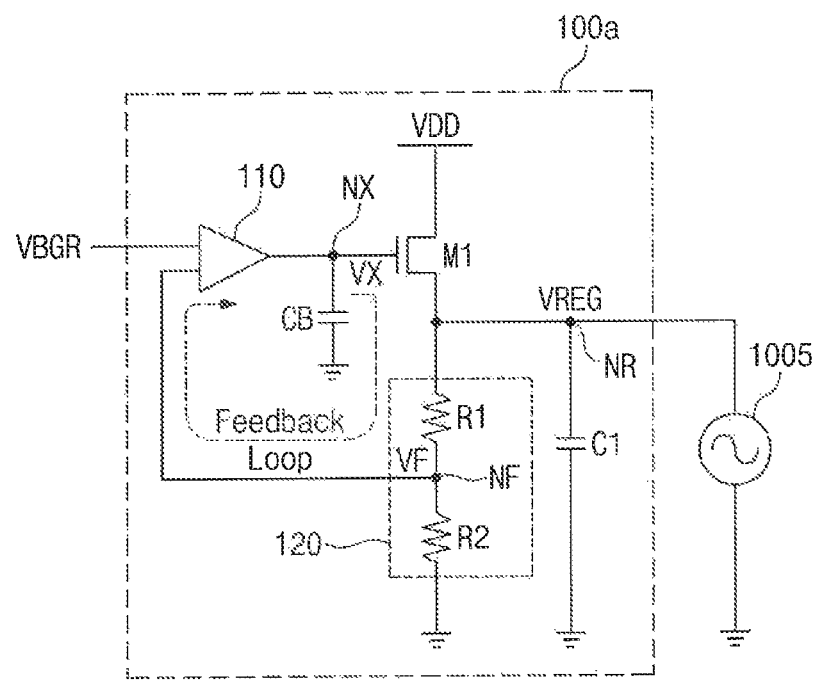
FIG. 2A illustrates a low-dropout regulator (LDO regulator) of FIG. 1 in detail, according to an embodiment of the present disclosure.

FIG. 2A illustrates an LDO regulator of FIG. 1 in detail, according to an embodiment of the present disclosure. Referring to FIGS. 1 and 2A, an LDO regulator 100a may include an error amplifier 110, a pass transistor M1, a capacitor CB, a feedback circuit 120, and a capacitor C1. The capacitor CB may be a capacitor for varying a bandwidth of the LDO regulator 100a.

The error amplifier 110 may include a first input terminal (e.g., a non-inverting input terminal) to which the reference voltage VBGR is applied and a second input terminal (e.g., an inverting input terminal) to which a feedback voltage VF is applied. The error amplifier 110 may amplify a potential difference between the reference voltage VBGR and the feedback voltage VF. The error amplifier 110 may output a voltage VX corresponding to the amplified potential difference. An operation of the error amplifier 110 will be more fully described with reference to FIG. 7.

The pass transistor M1 may include a gate to which the voltage VX from the error amplifier 110 is applied, a first end (e.g., a drain) to which a driving voltage VDD is applied, and a second end (e.g., a source) connected to a node NR that is an output terminal of the LDO regulator 100a. The second end of the pass transistor M1 may be connected to the feedback circuit 120. For example, the second end of the pass transistor M1 may be directly connected to the feedback circuit 120. The pass transistor M1 may control the regulated voltage VREG, which is output from the LDO regulator 100a and is applied to the feedback circuit 120, based on the voltage VX. An example is illustrated in FIG. 2A in which the pass transistor M1 is implemented with an n-type metal-oxide-semiconductor (NMOS) transistor, but the pass transistor M1 may be implemented with a p-type metal-oxide-semiconductor (PMOS) transistor.

The feedback circuit 120 may be connected between the pass transistor M1 and a ground node. The feedback circuit 120 may receive the regulated voltage VREG from the pass transistor M1. The feedback circuit 120 may output the feedback voltage VF to the error amplifier 110 based on the regulated voltage VREG.

The feedback circuit 120 may include resistors R1 and R2. A first end of the resistor R1 may be connected to the node NR, and a second end of the resistor R1 may be connected to the resistor R2. The resistor R2 may be connected between a node NF which is a connection node of the resistors R1 and R2 and the ground node. The regulated voltage VREG may be divided by a resistance ratio of the resistors R1 and R2. The divided voltage may be output, from the node NF as the feedback voltage VF.

In an embodiment of the present disclosure illustrated in FIG. 2A, the error amplifier 110, the pass transistor M1, and the feedback circuit 120 may be included in a feedback loop. The feedback loop may be a loop that starts from the node NX, which is an output terminal of the error amplifier 110, passes through the gate of the pass transistor M1, the second end of the pass transistor M1, and the feedback circuit 120, and ends at the second input terminal of the error amplifier 110 (e.g., the feedback loop is a loop in which an output of the error amplifier 110 is circled back and is used as an input of the error amplifier 110). The regulated voltage VREG output from the LDO regulator 100a may be stabilized through the feedback loop.

The capacitor C1 may be connected between the node NR and the ground node. The capacitor C1 may stabilize the regulated voltage VREG that is output from the node NR that is the output terminal of the LDO regulator 100a.

The node NR may be connected to the voltage-controlled oscillator 1005. As such the regulated voltage VREG may be supplied from the LDO regulator 100a to the voltage-controlled oscillator 1005.

As described with reference to FIG. 1, the voltage-controlled oscillator 1005 may output the output frequency signal FOUT to the outside of the phase locked loop circuit 1000 based on the regulated voltage VREG. The frequency of the output frequency signal FOUT may be used as a clock signal within various electronic devices (e.g., an electronic device 2000 of FIG. 11) including the phase locked loop circuit 1000. Accordingly, the frequency of the output frequency signal FOUT may need to reach a target frequency stably. Accordingly, the LDO regulator 100a may need to supply a stable regulated voltage VREG (e.g., the regulated voltage VREG of a uniform potential or a low jitter) to the voltage-controlled oscillator 1005 quickly.

A noise introduced to the LDO regulator 100a or noise generated in the LDO regulator 100a may include a noise of the reference voltage VBGR applied from the BGR 1009, a noise amplified by the error amplifier 110, a noise coming from parasitic elements of the pass transistor M1, a noise coming from the resistors R1 and R2 in the feedback circuit 120, and the like. The noise of the reference voltage VBGR and the noise amplified by the error amplifier 110 may be referred to as a "deterministic noise". The aforementioned noises may be included in the regulated voltage VREG and thus may be reflected to the output frequency signal FOUT. In other words, these noises may impact the output frequency signal FOUT. This may cause an increase of a phase noise of the output frequency signal FOUT, thereby reducing the performance of the phase locked loop circuit 1000.

Noise exceeding a bandwidth of the LDO regulator 100a from among the above described noises may be removed naturally during an operation of the LDO regulator 100a. However, noises (e.g., a thermal noise and a flicker noise) of a low-frequency band equal to or less than the bandwidth of the LDO regulator 100a may not be removed. Such noises may be included in the regulated voltage VREG, and thus, the noises may be introduced to the voltage-controlled oscillator 1005. As such, the LDO regulator 100a may include the capacitor CB to improve the performance of the phase locked loop circuit 1000 by supplying the regulated voltage VREG of a low noise.

The capacitor CB may cause a change of the bandwidth of the LDO regulator 100a. For example, as a capacitance of the capacitor CB increases, the bandwidth of the LDO regulator 100a may decrease (or a position of a dominant pole (or a first pole) of a transfer function of the LDO regulator 100a may change). In other words, the LDO regulator 100a may pass a signal of a lower frequency band. Accordingly, a noise of the reference voltage VBGR, which is an input voltage of the LDO regulator 100a, and a noise of the error amplifier 110 itself may be removed significantly more due to the capacitor CB. In this case, a low-noise characteristic of the LDO regulator 100a may be improved.

However, the bandwidth of the LDO regulator 100a reduced due to the capacitor CB may cause degradation of a transient characteristic of the regulated voltage VREG. In other words, a time taken for the regulated voltage VREG to be stabilized may increase. In contrast, as the capacitance of the capacitor CB decreases, the regulated voltage VREG may be more quickly stabilized. However, less noise may be removed from the regulated voltage VREG. In this case, a low-noise characteristic of the LDO regulator 100a may not be obtained.

Figure 2B:
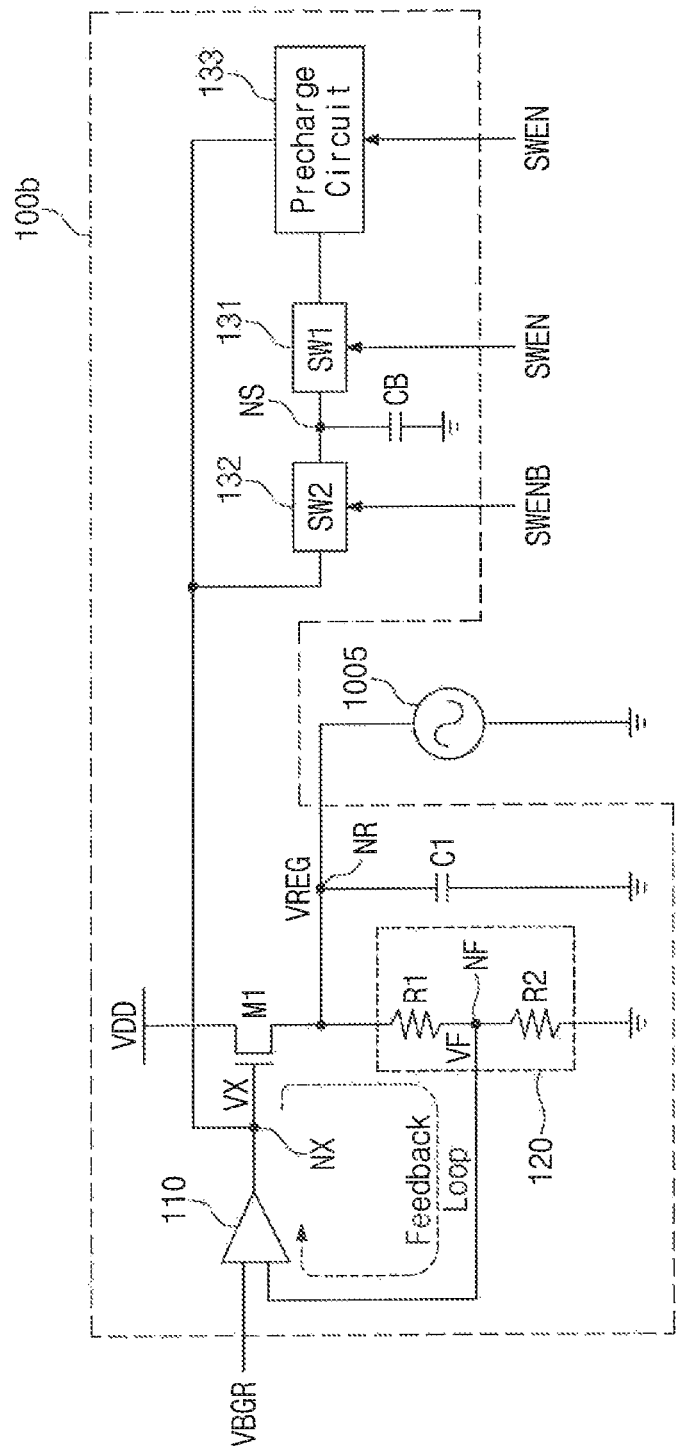
FIG. 2B illustrates an LDO regulator of FIG. 1 in detail, according to another embodiment of the present disclosure.

FIG. 2B illustrates an LDO regulator of FIG. 1 in detail, according to another embodiment of the present disclosure. A difference between the LDO regulator 100a of FIG. 2A and an LDO regulator 100b of FIG. 2B will be described with reference to FIGS. 1, 2A, and 2B.

The LDO regulator 100b may further include a first switch 131, a second switch 132, and a precharge circuit 133. Unlike the capacitor CB of the LDO regulator 100a of FIG. 2A which is connected to the output node NX of the error amplifier 110, the capacitor CB of the LDO regulator 100b of FIG. 2B may be connected between the first switch 131 and the second switch 132. For example, the capacitor CB may be connected to a node NS between the first switch 131 and the second switch 132. As such, a bandwidth of the LDO regulator 100b may decrease only in a specific time period (e.g., a second phase Phase2 of FIG. 4B).

The first switch 131 may be connected between the precharge circuit 133 and the second switch 132. In response to the switch signal SWEN, the first switch 131 may connect the precharge circuit 133 with the capacitor CB or may disconnect the precharge circuit 133 from the capacitor CB (or may separate the precharge circuit 133 from the capacitor CB).

The second switch 132 may be connected between the first switch 131 and the node NX that is the output terminal of the error amplifier 110. In response to the complementary switch signal SWENB, the second switch 132 may connect the capacitor CB with the node NX or may disconnect the capacitor CB from the node NX.

The precharge circuit 133 may be connected between the node NX and the first switch 131. As such, the precharge circuit 133 may separate the node NX from the first switch 131. Accordingly, even when the first switch 131 is turned on, the capacitor CB may not be directly connected to the node NX. The precharge circuit 133 may receive the voltage VX from the error amplifier 110. The precharge circuit 133 may be turned on or turned off in response to the switch signal SWEN. For example, a power supplied to the precharge circuit 133 may be blocked by the switch signal SWEN of logical low (or a logic low level). The precharge circuit 133 may block the power to the capacitor CB in response to the switch signal SWEN of logical low. The precharge circuit 133 may precharge the capacitor CB through the first switch 131 based on the voltage VX. In other words, the precharge circuit 33 may precharge the same voltage as (or a voltage at least close to) a gate voltage of the pass transistor M1 to the capacitor CB.

As described with reference to FIG. 2A, when the capacitor CB is connected to the node NX, a bandwidth of the LDO regulator 100b may decrease. As such, load fluctuations of the node NX may make a response speed of a feedback loop slow. Therefore, a time needed for initial stabilization of the regulated voltage VREG output from the LDO regulator 100b may increase.

For example, a load current of a step response, which flows from the LDO regulator 100b to the voltage-controlled oscillator 1005 as the voltage-controlled oscillator 1005 starts to oscillate, may be generated. Undershoot of the regulated voltage VREG may occur due to the load current of the step response. In this case, due to a response speed of a feedback loop, which is slowed down due to the capacitor CB, the regulated voltage VREG may be stabilized (or restored) relatively slowly compared to the case where the capacitor CB does not exist. As such, an unstable regulated voltage VREG may be supplied to the voltage-controlled oscillator 1005. As a result, a time needed for the output frequency signal FOUT output from the voltage-controlled oscillator 1005 to stabilize may also increase due to the capacitor CB.

Unlike the capacitor CB of the LDO regulator 100a of FIG. 2A, the capacitor CB of the LDO regulator 100b of FIG. 2B may be directly connected to a feedback loop only in a specific time period. As such, the bandwidth of the LDO regulator 100b of FIG. 2B may decrease only in the specific time period. For example, in a case where it is determined that the output frequency signal FOUT output from the phase locked loop circuit 1000 is stabilized, the capacitor CB may then be connected to the LDO regulator 100b such that low frequency noises of the LDO regulator 100b are sufficiently removed. In other words, from a time when the LDO regulator 100b (or the phase locked loop circuit 1000) is turned on to a time when a phase of the output frequency signal FOUT is locked, the bandwidth of the LDO regulator 100b may not decrease to such an extent that low frequency noises are sufficiently removed. As such, a response speed of a feedback loop in the LDO regulator 100b may not decrease before a phase of the output frequency signal FOUT is locked. Accordingly, the regulated voltage VREG output from the LDO regulator 100b of FIG. 2B may be stabilized more quickly than the regulated voltage VREG output from the LDO regulator 100a of FIG. 2A. An operation of the LDO regulator 100b of FIG. 2B will be more fully described with reference to FIGS. 4A and 4B.

Figure 3:
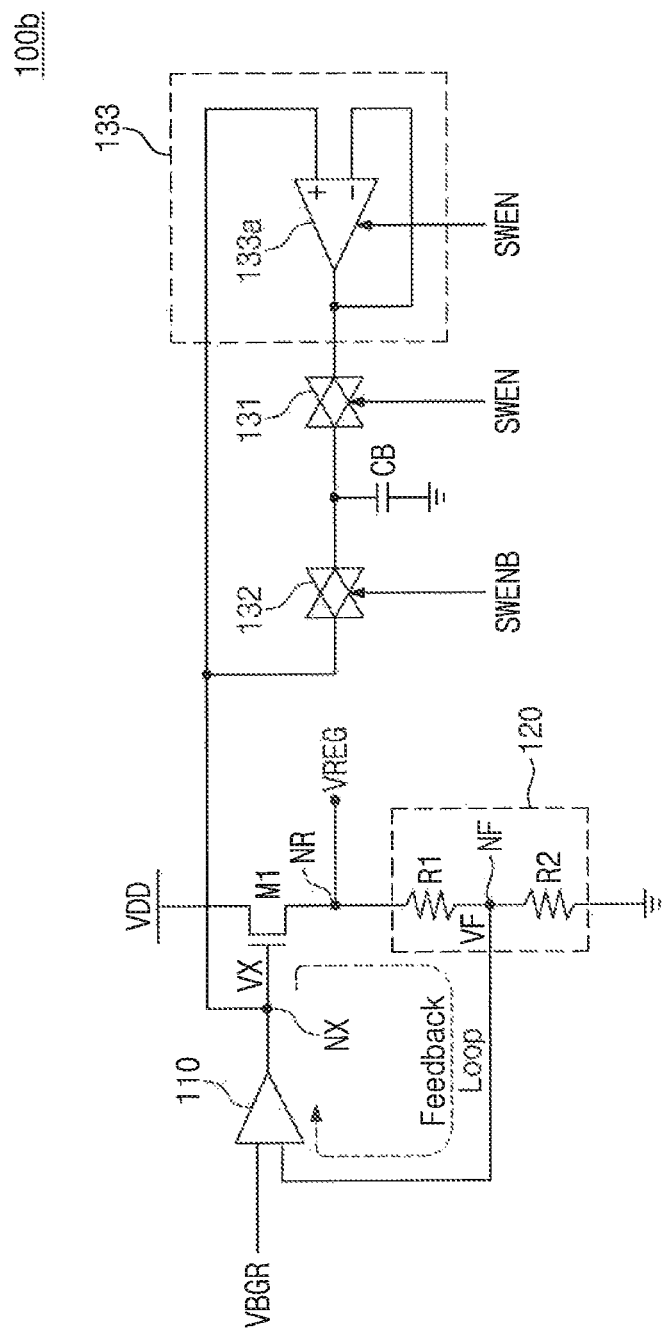
FIG. 3 is a circuit diagram of an LDO regulator of FIG. 2B.

FIG. 3 is a circuit diagram of an LDO regulator of FIG. 2B. Referring to FIGS. 1, 2A, 2B, and 3, the first switch 131 and the second switch 132 may be implemented with a transmission gate.

The precharge circuit 133 may include an amplifier 133a. The amplifier 133a may include a non-inverting input terminal connected to the node NX, an output terminal connected to the first switch 131, and an inverting input terminal connected to an output terminal of the amplifier 133a. The amplifier 133a may also be referred to as a "unit gain amplifier" or a "unit gain buffer".

The amplifier 133a may receive the voltage VX from the node NX. The amplifier 133a may be turned on or turned off in response to the switch signal SWEN. The amplifier 133a may apply a voltage, which is based on the voltage VX, to the capacitor CB through the first switch 131. As such, the amplifier 133a may charge the capacitor CB. Operations of the amplifier 133a, the first switch 131, and the second switch 132 will be more fully described with reference to FIGS. 4A and 4B.

Figure 4A:
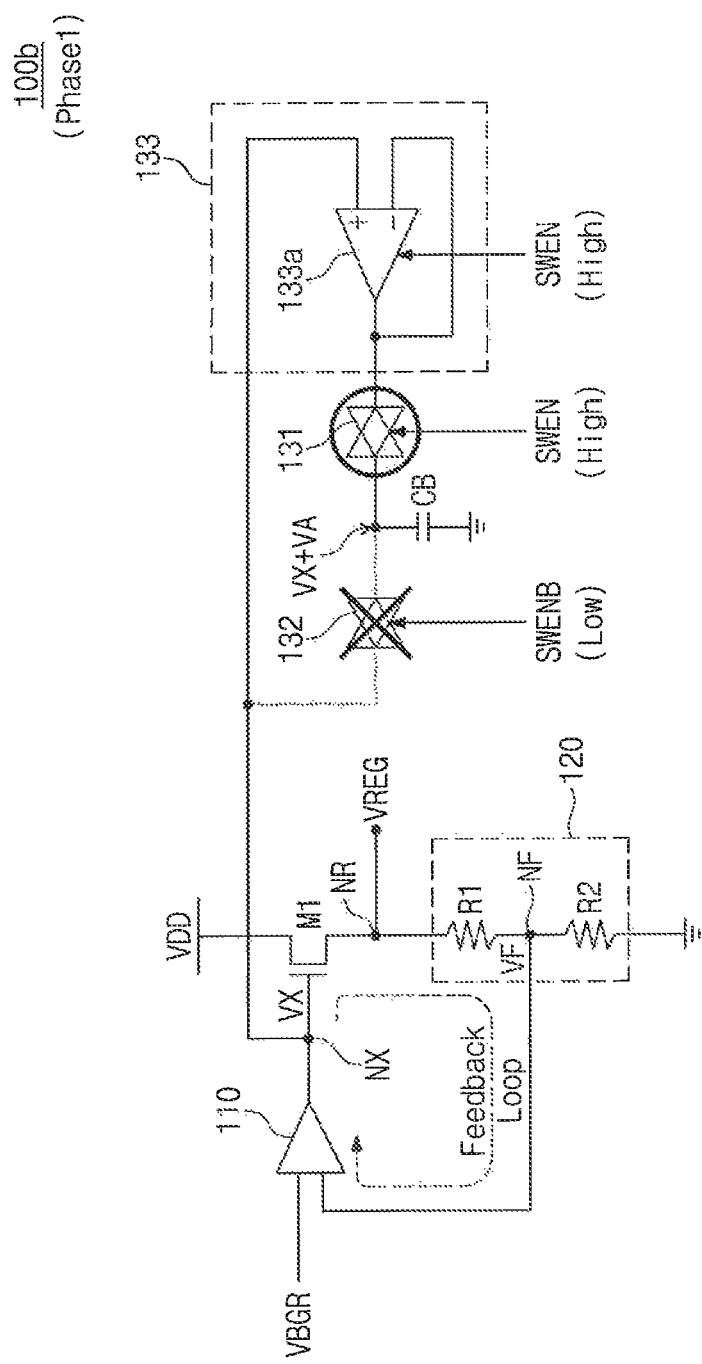
FIGS. 4A and 4B illustrate an operation of an LDO regulator of FIG. 2B in detail.
Figure 4B:
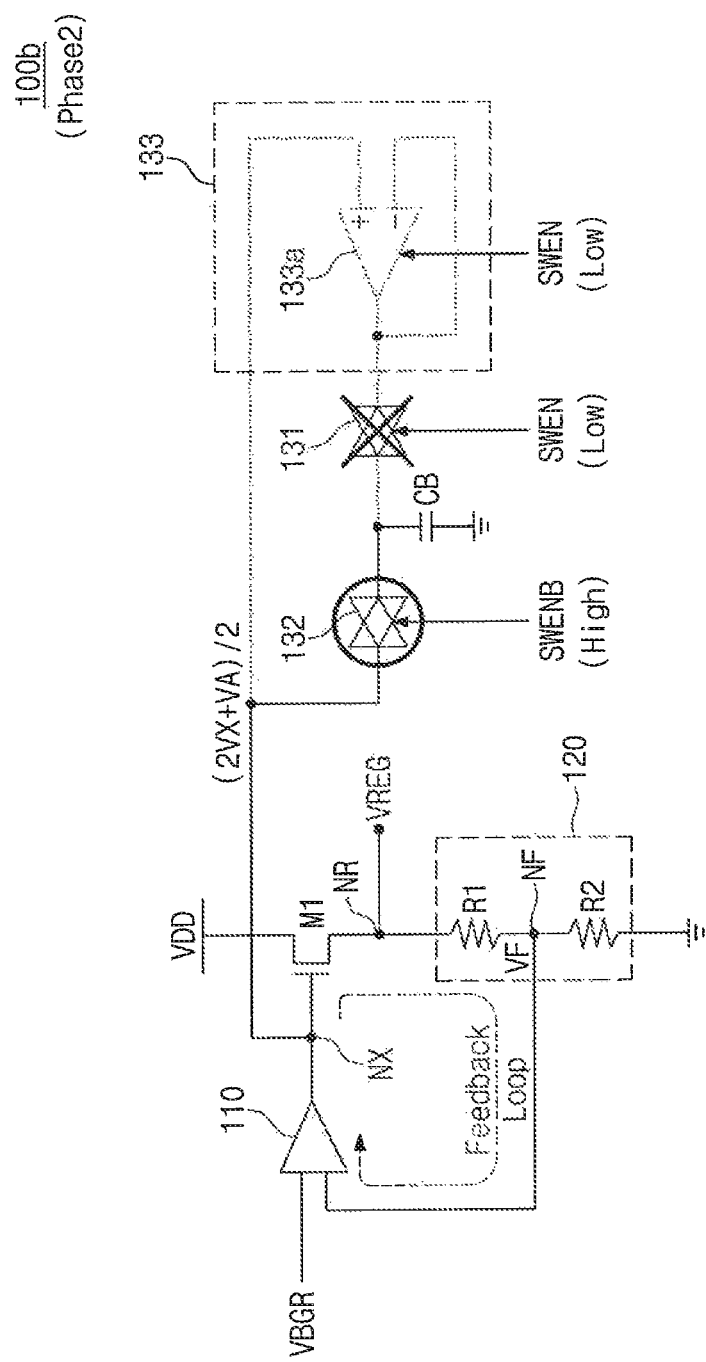

FIGS. 4A and 4B illustrate an operation of an LDO regulator of FIG. 2B in detail. Referring to FIGS. 1, 2B, 3, 4A, and 4B, unlike the LDO regulator 100a of FIG. 2A, the LDO regulator 100b may differently operate in a first phase Phase1 and a second phase Phase2. The LDO regulator 100b may operate in the first phase Phase1 from when the LDO regulator 100b is turned on to when a phase of the output frequency signal FOUT is locked. The LDO regulator 100b may operate in the second phase Phase2 from when the phase of the output frequency signal FOUT is locked to when the LDO regulator 100b is turned off.

Referring to FIG. 4A, in the first phase Phase1, the switch signal SWEN may have a high level corresponding to logical high, and the complementary switch signal SWENB may have a low level corresponding to logical low. As such, the first switch 131 and the amplifier 133a of the precharge circuit 133 may be turned on, and the second switch 132 may be turned off. As a result, in the first phase Phase1, because the capacitor CB is not directly connected to the node NX, the bandwidth of the LDO regulator 100b may not decrease.

A voltage of the node NX may be stabilized to the voltage VX through a feedback loop. The voltage VX may be a voltage that makes it possible for the LDO regulator 100b to provide the voltage-controlled oscillator 1005 with a fixed voltage stabilized to such an extent that the output frequency signal FOUT is capable of being used by an external device. Since the amplifier 133a is turned on and the amplifier 133a is connected to the capacitor CB through the first switch 131, the precharge circuit 133 may precharge the capacitor CB based on the voltage VX of the node NX. Due to a finite gain of the amplifier 133a, a deviation (or an offset) may occur between the voltage charged to the capacitor CB and the voltage VX. A voltage VA may be a voltage associated with the above difference. In other words the voltage VA may correspond to the difference between the voltage charged to the capacitor CB and the voltage VX. Accordingly, during the first phase Phase1, the capacitor CB may be precharged to a voltage of "VX+VA" by the amplifier 133a.

Referring to FIG. 4B, in the second phase Phase2, the switch signal SWEN may have the low level corresponding to logical low, and the complementary switch signal SWENB may have the high level corresponding to logical high. As such, the first switch 131 and the amplifier 133a of the precharge circuit 133 may be turned off, and the second switch 132 may be turned on. As a result, the capacitor CB may be directly connected to the node NX.

Since the second switch 132 is turned on, charges precharged to the capacitor CB may be discharged to the node NX. In other words, charge sharing may occur between the capacitor CB and the node NX. As such, a voltage of the node NX may instantly converge to "(2VX+VA)/2". Afterwards, the voltage of the node NX may be again stabilized to the voltage VX through the feedback loop. The bandwidth of the LDO regulator 100b may decrease due to the capacitor CB connected between the node NX and the ground node. Accordingly, a noise in a low frequency band introduced to the regulated voltage VREG may be greatly removed, and thus, a phase noise characteristic of the output frequency signal FOUT may be improved.

During the first phase Phase1, the precharge circuit 133 may precharge a voltage of "VX+VA" close to "VX", which is the gate voltage of the pass transistor M1, to the capacitor CB. In this case, a magnitude of "VA," which is a voltage associated with a finite gain of the amplifier 133a, may be relatively small compared to "VX". Therefore, at a time when a transition from the first phase Phase1 to the second phase Phase2 is made, "(2VX+VA)/2", which is an instant voltage of the node NX, may be very close to "VX". Accordingly, it is possible to prevent a voltage from being shot at the gate of the pass transistor M1 due to the charge sharing between the node NX and the capacitor CB at the beginning of the second phase Phase2.

Because the shooting of the gate voltage of the pass transistor M1 is prevented by the precharge circuit 133, the stability of the regulated voltage VREG may also be seamless at the time when the transition from the first phase Phase1 to the second phase Phase2 is made. In the second phase Phase2, because the capacitor CB is directly connected to the node NX, noises in a low frequency band may be greatly removed, but a speed of the feedback loop may be slowed down at the same time. In this case, because the stability of the regulated voltage VREG is maintained, the regulated voltage VREG may not be affected by the decrease in the speed of the feedback loop. As a result, in the second phase Phase2, a frequency of the output frequency signal FOUT may be maintained at a target frequency, and a phase noise characteristic of the output frequency signal FOUT may also be improved.

Since the capacitor CB is separated from the feedback loop in the first phase Phase1, the regulated voltage VREG may be stabilized at a fast speed. In other words, in the first phase Phase 1, the regulated voltage VREG may be quickly stabilized. Accordingly, a time period where the LDO regulator 100b operates in the first phase Phase1 may be relatively small compared to a time period where the LDO regulator 100b operates in the second phase Phase2. In addition, in the second phase Phase2, the precharge circuit 133 may be turned off in response to the switch signal SWEN of the low level. Therefore, the amount of power consumption of the LDO regulator 100b of FIG. 2B may be similar to the amount of power consumption of the LDO regulator 100a of FIG. 2A.

Since the LDO regulator 100b of FIG. 2B operates differently in the first phase Phase1 and the second phase Phase2, the LDO regulator 100b may shorten a time taken to stabilize the output frequency signal FOUT without degrading the phase noise performance of the phase locked loop circuit 1000. For example, in the first phase Phase1, because the capacitor CB is not directly connected to the node NX, unlike the LDO regulator 100b of FIG. 2A, the bandwidth of the LDO regulator 100b of FIG. 2B may not significantly decrease. Accordingly, a speed of the feedback loop of the LDO regulator 100b of FIG. 2B may be faster than a speed of the feedback loop of the LDO regulator 100a of FIG. 2A.

In contrast, the separation between the capacitor CB from the node NX in the first phase Phase1 may not greatly influence the phase noise characteristic of the phase locked loop circuit 1000 and a power supply rejection ratio (PSRR) characteristic of the LDO regulator 100b. The reason for this is as follows: because a phase of the output frequency signal FOUT is not locked in the first phase Phase1, the probability that the output frequency signal FOUT is not used by an external device of the phase locked loop circuit 1000 is very high, and thus, noises introduced to the regulated voltage VREG in the fist phase Phase1 do not influence an operation of the phase locked loop circuit 1000.

According to an embodiment of the present disclosure, there is provided an electronic device 1000 including: a regulator circuit 100b configured to output a regulated voltage VREG based on a reference voltage VBGR and a feedback voltage VF; and an oscillator 1005 configured to generate an output frequency signal FOUT based on a reference frequency signal FREF and the regulated voltage VREG output from the regulator circuit 100b. The regulator circuit 100b may include: a feedback loop (e.g., 110, M1, 120) configured to output the regulated voltage VREG based on a difference between the reference voltage VBGR and the feedback voltage VF; a first capacitor CB; a precharge circuit 133 connected to the feedback loop (e.g., 110, M1, 120), and configured to charge the first capacitor CB with a second voltage which is based on a first voltage VX; a first switch SW1 configured to connect the precharge circuit 133 with the first capacitor CB; and a second switch SW2 configured to connect the first capacitor CB with the feedback loop (e.g., 110, M1, 120).

Figure 5:
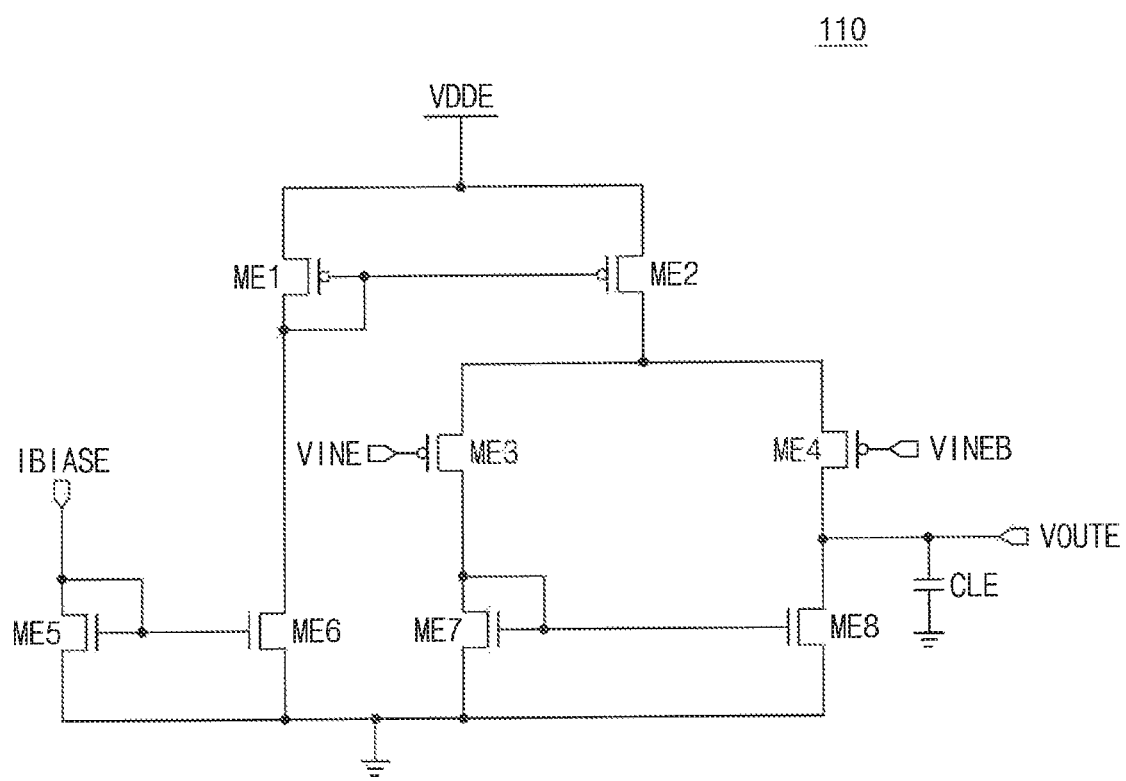
FIG. 5 is a circuit diagram of an error amplifier of FIGS. 2A and 2B.
Figure 6:
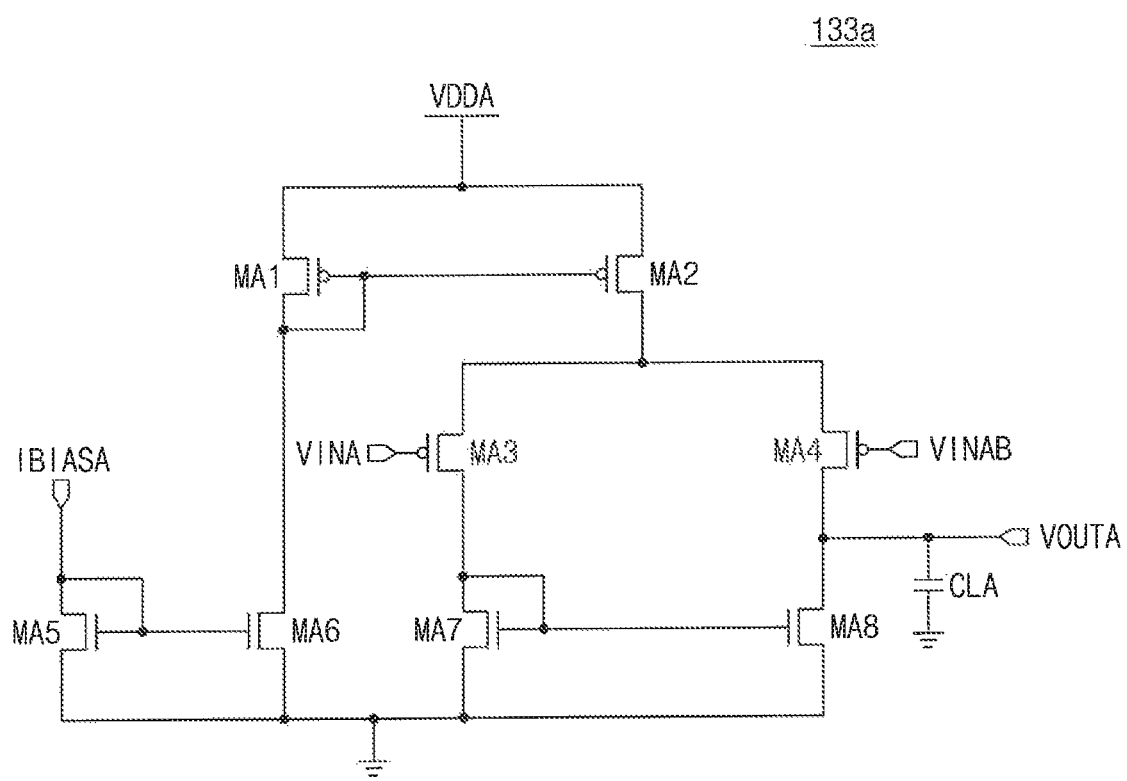
FIG. 6 is a circuit diagram of an amplifier of FIG. 2B.

FIG. 5 is a circuit diagram of an error amplifier of FIGS. 2A and 2B. FIG. 6 is a circuit diagram of an amplifier of FIG. 2B. A difference between the error amplifier 110 and the amplifier 133a will be more fully described with reference to FIGS. 1, 2A, 2B, 3, 4A, 4B, 5, and 6.

Referring to FIG. 5, the error amplifier 110 may include transistors ME1, ME2, ME3, ME4, ME5, ME6, ME7 and ME8 and a capacitor CLE. In an embodiment of the present disclosure illustrated in FIG. 5, the transistors ME1 to ME4 may be implemented with a PMOS transistor. The transistors ME5 to ME8 may be implemented with an NMOS transistor. The error amplifier 110 may be supplied with a driving voltage VDDE. A gate of the transistor ME3 and a gate of the transistor ME4 may be the non-inverting input terminal and the inverting input terminal of the error amplifier 110, respectively. As such, a non-inverting voltage VINE may be applied to the transistor ME3, and an inverting voltage VINEB may be applied to the transistor ME4. A bias current IBIASE may be applied to a first end (e.g., a drain) of the transistor ME5. A node between the transistor ME4 and the transistor ME8 may be the output terminal of the error amplifier 110. For example, a node directly connected between the transistor ME4 and the transistor ME8 may be the output terminal of the error amplifier 110. A voltage VOUTE may be output from the output terminal of the error amplifier 110. The capacitor CLE may be a load capacitor of the output terminal of the error amplifier 110. The capacitor CLE may be directly connected to the node between the transistor ME4 and the transistor ME8. For example, the non-inverting voltage VINE may be the reference voltage VBGR, the inverting voltage VINEB may be the feedback voltage VF, and the voltage VOUTE may be the voltage VX.

Referring to FIG. 6, the amplifier 133a may include transistors MA1, MA2, MA3, MA4, MA5, MA6, MA7 and MA8 and a capacitor CLA. The amplifier 133a may be included in the precharge circuit 133. In an embodiment of the present disclosure illustrated in FIG. 6, the transistors MA1 to MA4 may be implemented with a PMOS transistor. The transistors MA5 to MA8 may be implemented with an NMOS transistor. The amplifier 133a may be supplied with a driving voltage VDDA. A gate of the transistor MA3 and a gate of the transistor MA4 may be the non-inverting input terminal and the inverting input terminal of the amplifier 133a, respectively. As such, a non-inverting voltage VINA may be applied to the transistor MA3, and an inverting voltage VINAB may be applied to the transistor MA4. A bias current IBIASA may be applied to a first end (e.g., a drain) of the transistor MA5. A node between the transistor MA4 and the transistor MA8 may be the output terminal of the amplifier 133a. In other words, a node directly connected to the transistor MA4 and the transistor MA8 may be the output terminal of the amplifier 33a. A voltage VOUTA may be output from the output terminal of the amplifier 133a. The capacitor CLA may be a load capacitor of the output terminal of the amplifier 133a. The capacitor CLA may be directly connected to the node between the transistor MA4 and the transistor MA8. For example, the non-inverting voltage VINA may be the voltage VX.

The driving voltages VDDE and VDDA may be supplied from the outside of the LDO regulator 100/100b. The driving voltages VDDE and VDDA may be identical or different.

To minimize a time additionally needed for the stabilization of the regulated voltage VREG in transitioning from the first phase Phase1 to the second phase Phase2, a bandwidth of the amplifier 133a may have to be greater than a bandwidth of the LDO regulator 100b. For example, because the capacitor CB is separated from the node NX in the first phase Phase1, the regulated voltage VREG may be stabilized quickly. Therefore, to effectively prevent the shooting of the gate voltage of the pass transistor M1, the amplifier 133a should precharge the capacitor CB at a speed faster than a speed at which the regulated voltage VREG is stabilized. In addition, a gain of the amplifier 133a should be as great as possible to minimize a voltage associated with an offset such that the charge sharing between the node NX and the capacitor CB in the second phase Phase2 is minimized.

The bandwidth of be amplifier 133a may be proportional of a ratio of an output load capacitance (e.g., a capacitance of the capacitor CLA) to a transconductance of input transistors (e.g., a total of transconductances of the transistors MA3 and MA4). To increase the transconductance of the input transistors, the transistor MA2 to which the driving voltage VDDA is applied, the transistor MA3 connected to the non-inverting input terminal of the amplifier 133a, and the transistor MA4 connected to the inverting input terminal of the amplifier 133a may be implemented to be larger than the transistor ME2 to which the driving voltage VDDE is applied, the transistor ME3 connected to the non-inverting input terminal of the error amplifier 110, and the transistor ME4 connected to the inverting input terminal of the error amplifier 110. In other words, the size of the transistors MA2, MA3, and MA4 may be greater than the size of the transistors ME2, ME3, and ME4. For example, the size of the transistors MA2, MA3, and MA4 may be two times the size of the transistors ME2, ME3, and ME4. As such, the bandwidth of the amplifier 133a may be greater than the bandwidth of the error amplifier 110. As a result, the amplifier 133a may have a bandwidth greater than the bandwidth of the error amplifier 110.

Figure 7:
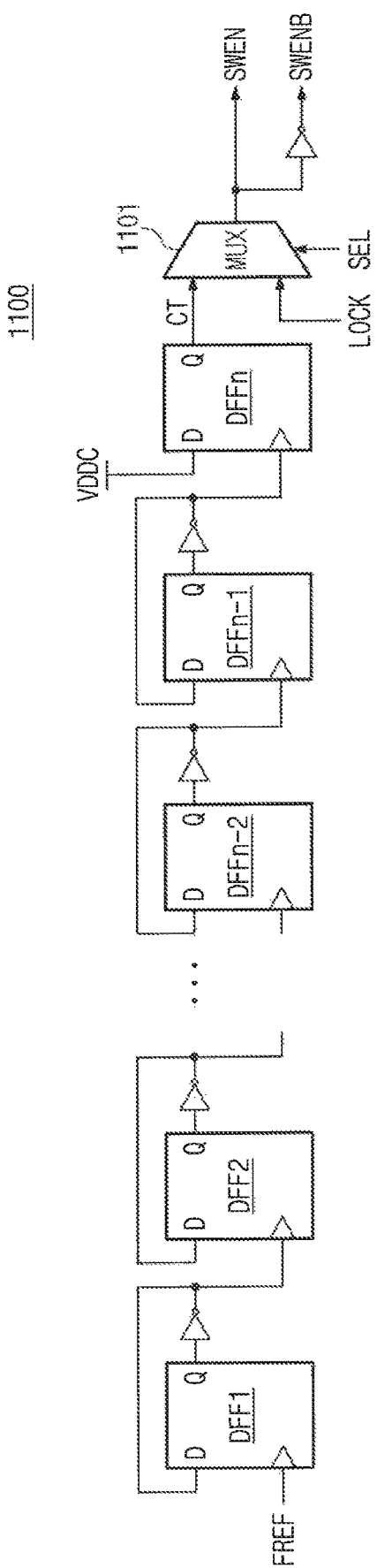
FIG. 7 is a block diagram of a control signal generator of FIG. 1.

FIG. 7 is a block diagram of a control signal generator of FIG. 1. Referring to FIGS. 1, 2B, 4A, 4B, and 7, the control signal generator 1100 may include a plurality of D flip-flops DFF1 to DFFn (n being a natural number) connected in series, inverters respectively connected to the D flip-flops DFF1 to DFFn, a multiplexer 1101, and an inverter connected to an output terminal of the multiplexer 1101. When the phase locked loop circuit 1000 is turned on, the D flip-flops DFF1 to DFFn may be reset such that output values (e.g., "Q") are set to a value corresponding to logical low.

The D flip-flop DFF1 may receive the reference frequency signal FREF as a clock signal. A signal corresponding to logical low may be output from the D flip-flop DFF1 in synchronization with a rising edge of the reference frequency signal FREF. The signal output from the D flip-flop DFF1 may be inverted by the inverter connected thereto to correspond to logical high. The inverted signal may be input to the D flip-flop DFF2 as a clock signal. Each of the D flip-flops DFF3 to DFFn−1 may operate the same as the D flip-flop DFF2.

The D flip-flop DFFn may be supplied with a driving voltage VDDC as a data signal. The driving voltage VDDC may be supplied from the outside of the phase locked loop circuit 1000. The D flip-flop DFFn may receive a signal, which is obtained by inverting an output signal of the D flip-flop DFFn−1, as a clock signal. The D flip-flop DFFn may output a counter signal CT to the multiplexer 1101.

Depending on the number of D flip-flops DFF1 to DFFn, the counter signal CT corresponding to logical high may be output after a time passes from a time when the D flip-flop DFF1 receives the first rising edge of the reference frequency signal FREF. In other words, the counter signal CT corresponding to logical high may be output after a time corresponding to how long it takes the D flip-flop DFFn to generate an output signal from a time when the D flip-flop DFF1 first receives the first rising edge of the reference frequency signal FREF. In other words, the time is takes to output the counter signal CT may depend on the number of D flip-flops in the control signal generator 1100. For example, in the case where the number of D flip-flops DFF1 to DFFn is "n", the counter signal CT may correspond to logical high at a time when the D flip-flop DFF1 receives a $2^n$-th rising edge of the reference frequency signal FREF. In other words, the control signal generator 1100 may generate the switch signal SWEN and the complementary switch signal SWENB by counting the number of rising edges of the reference frequency signal FREF.

The number of D flip-flops DFF1 to DFFn may be determined in advance. For example, the number of D flip-flops DFF1 to DFFn may be determined in consideration of a characteristic of the phase locked loop circuit 1000. As another example, the number of D flip-flops DFF1 to DFFn may be determined based on a simulation result of the phase locked loop circuit 1000.

The multiplexer 1101 may receive the counter signal CT from the D flip-flop DFFn. The multiplexer 1101 may receive the lock signal LOCK from the lock detector 1008. The multiplexer 1101 may receive a selection signal SEL. The selection signal SEL may be received from the outside of the control signal generator 1100. For example, the selection signal SEL may be received from a controller of the phase locked loop circuit 1000 or from an external device of the phase locked loop circuit 1000. The multiplexer 1101 may output the switch signal SWEN (or SWENB) based on the counter signal CT, the lock signal LOCK, and the selection signal SEL. For example, based on the selection signal SEL, the multiplexer 1101 may output one of the lock signal LOCK and the counter signal CT as the switch signal SWEN.

As another example, in response to the counter signal CT corresponding to logical low, the multiplexer 1101 may output the switch signal SWEN corresponding to logical high. In response to the counter signal CT corresponding to logical high, the multiplexer 1101 may output the switch signal SWEN corresponding to logical low.

The inverter connected to the output terminal of the multiplexer 1101 may output the complementary switch signal SWENB by inverting the switch signal SWEN. A relationship between the lock signal LOCK, the switch signal SWEN, and the complementary switch signal SWENB will be more fully described later.

In the embodiment of the present disclosure illustrated in FIG. 7, the control signal generator 1100 is implemented with an asynchronous counter (or a ripple counter) based on the reference frequency signal FREF, but the configuration of the control signal generator 1100 is not limited thereto. For example, the control signal generator 1100 may be implemented to generate the switch signal SWEN and the complementary switch signal SWENB based on the lock signal LOCK, regardless of the reference frequency signal FREF.

Figure 8:
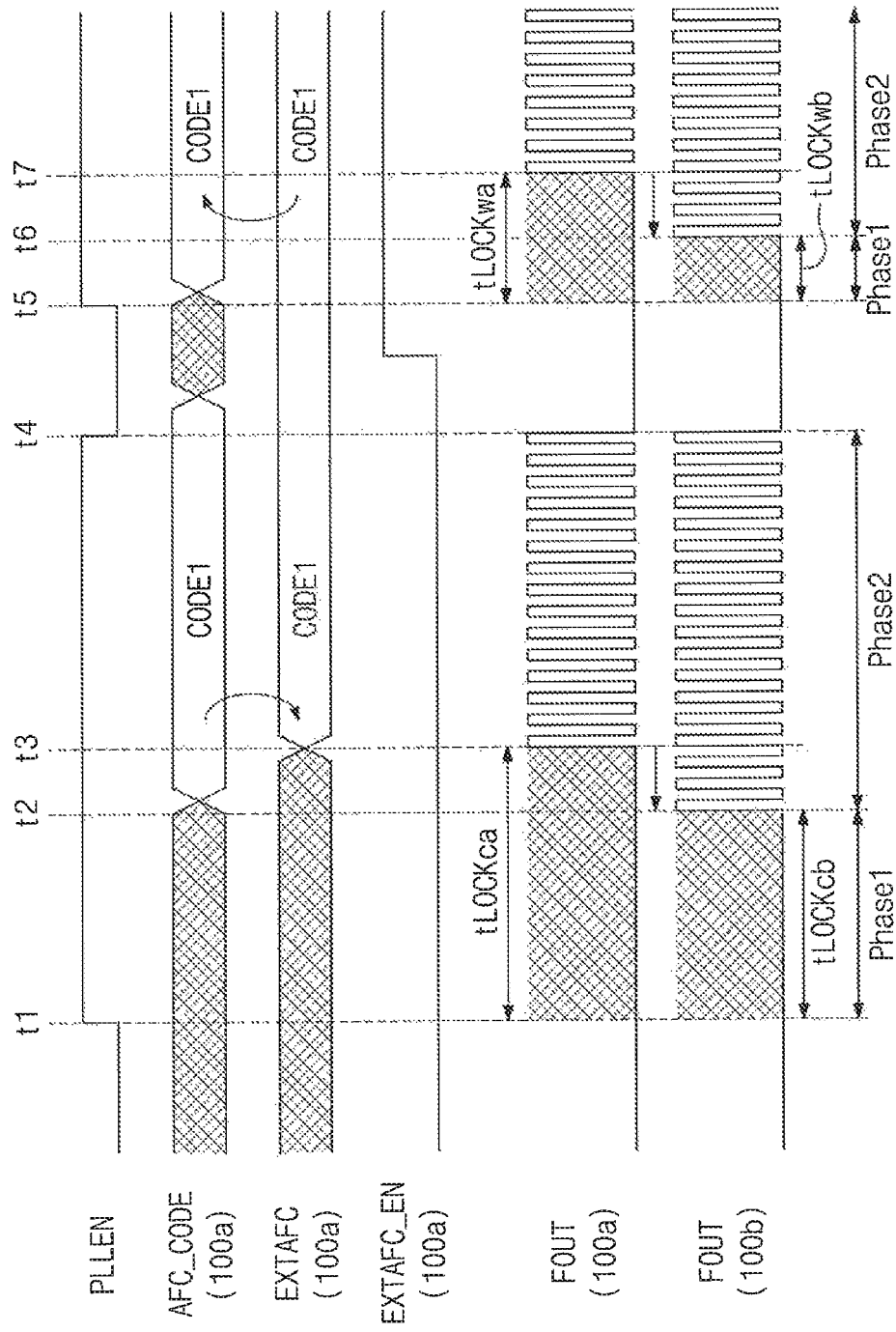
FIG. 8 is a timing diagram of signals used in a phase locked loop circuit of FIG. 1 and a voltage output from the phase locked loop circuit.

FIG. 8 is a timing diagram of signals used in a phase locked loop circuit of FIG. 1 and a voltage output from the phase locked loop circuit. An operation of the phase locked loop circuit 1000 will be more fully described with reference to FIGS. 1, 2A, 2B, 4A, 4B, and 8.

The phase locked loop circuit 1000 may be turned on or turned off in response to a PLL enable signal PLLEN. For example, a power may be supplied to the phase locked loop circuit 1000 in response to the PLL enable signal PLLEN of the high level corresponding to logical high. The power to the phase locked loop circuit 1000 may be blocked in response to the PLL enable signal PLLEN of the low level corresponding to logical low. The phase locked loop circuit 1000 may receive the PLL enable signal PLLEN from the outside of the phase locked loop circuit 1000.

At a time t1, the PLL enable signal PLLEN of the high level may be applied to the phase locked loop circuit 1000. As such, the phase locked loop circuit 1000 may be turned on, and the power may be supplied to the phase locked loop circuit 1000. In other words, an operation of the phase locked loop circuit 1000 may start.

In the case of the phase locked loop circuit 1000 including the LDO regulator 100a of FIG. 2A, the output frequency signal FOUT may be generated by the phase locked loop circuit 1000 from the time t1. However, a frequency of the output frequency signal FOUT may not be locked during a given time from the time t1.

For example, the following times may be required to lock the frequency of the output frequency signal FOUT: a time for stabilizing the regulated voltage VREG output from the LDO regulator 100a, a time for setting the frequency of the output frequency signal FOUT to a target frequency by the AFC 1007, and a time for locking a phase of the output frequency signal FOUT set to the target frequency. A sum of the above times (e.g., a time necessary to lock the phase locked loop circuit 1000) may be referred to as a "lock time".

Before a phase of the output frequency signal FOUT is locked, the phase (or frequency) of the output frequency signal FOUT may fluctuate, which makes the output frequency signal FOUT unusable as a clock signal. In other words, an external device of the phase locked loop circuit 1000 may not be able to appropriately use the output frequency signal FOUT. Accordingly, in the embodiment of the present disclosure illustrated in FIG. 8, the output frequency signal FOUT may be invalid during a time period marked by a grid (e.g., a time period from the time t1 to a time t3).

In the case of the phase locked loop circuit 1000 including the LDO regulator 100a of FIG. 2A, a frequency of the output frequency signal FOUT may be irregular from the time t1 from the time t3. Accordingly, a lock time tLOCKca may be a lock time of the phase locked loop circuit 1000 including the LDO regulator 100a of FIG. 2A. In other words, the lock time tLOCKca of the phase locked loop circuit 1000 including the LDO regulator 100a of FIG. 2A may be from the time t1 to the time t3.

During the lock time tLOCKca, the regulated voltage VREG that is output from the LDO regulator 100a may be stabilized. Afterwards, the frequency of the output frequency signal FOUT may be calibrated by the AFC 1007. For example, the AFC 1007 may generate the AFC code AFC_CODE and may provide the AFC code AFC_CODE to the voltage-controlled oscillator 1005. The AFC 1007 may receive the feedback frequency signal FFDB from the main divider 1006. The AFC 1007 may determine whether the frequency of the output frequency signal FOUT is set to the target frequency, based on the feedback frequency signal FFDB.

When it is determined that the frequency of the output frequency signal FOUT is not set to the target frequency, the AFC 1007 may calibrate the AFC code AFC_CODE based on the feedback frequency signal FFDB such that the frequency of the output frequency signal FOUT is set to the target frequency. In this case, the AFC 1007 may again provide the adjusted AFC code AFC_CODE to the voltage-controlled oscillator 1005. As the above process is repeated, the frequency of the output frequency signal FOUT may be set to the target frequency by the AFC 1007.

When it is determined that the frequency of the output frequency signal FOUT is set to the target frequency, the AFC 1007 may maintain the AFC code AFC_CODE finally calibrated, as a first code CODE1. The AFC code AFC_CODE may be invalid before the first code CODE1 is generated (e.g., in the time period marked by a grid of the AFC_CODE). For example, the AFC code AFC_CODE may be invalid for a period after time t2. The AFC 1007 may transmit the first code CODE1 to a storage device (e.g., a static random access memory (SRAM)) provided outside the phase locked loop circuit 1000. The storage device may store the first code CODE1 as the external AFC code EXTAFC.

After the frequency of the output frequency signal FOUT is set to the target frequency, the phase locked loop circuit 1000 may lock the frequency (or phase) of the output frequency signal FOUT. As such, from the time t3, the frequency of the output frequency signal FOUT may be locked to the target frequency, and the output frequency signal FOUT may be used as a clock signal of an external device of the phase locked loop circuit 1000.

In contrast, in the case of the phase locked loop circuit 1000 including the LDO regulator 100b of FIG. 2B, the regulated voltage VREG may be stabilized more quickly than in the case of the phase locked loop circuit 1000 including the LDO regulator 100a of FIG. 2A. As such, a frequency of the output frequency signal FOUT may not be regular from the time t1 to a time t2 preceding the time t3. Accordingly, a lock time tLOCKcb, which is a lock time of the phase locked loop circuit 1000 including the LDO regulator 100b of FIG. 2B, may be shorter than the lock time tLOCKca, which is a lock time of the phase locked loop circuit 1000 including the LDO regulator 100a of FIG. 2A. Accordingly, the frequency of the output frequency signal FOUT may be locked to the target frequency from the time t2, and the output frequency signal FOUT may be more quickly used as a clock signal of an external device of the phase locked loop circuit 1000.

In the embodiment of the present disclosure illustrated in FIG. 8, the LDO regulator 100b may operate in the first phase Phase1 from the time t1 to the time t2. The LDO regulator 100b may operate in the second phase Phase2 from the time t2, in other words, from when the output frequency signal FOUT is stabilized to when the LDO regulator 100b is turned off (or to when the LDO regulator 100b is turned off).

At a time t4, the PLL enable signal PLLEN may transition from the high level to the low level. When the PLL enable signal PLLEN is set to the low level, the phase locked loop circuit 1000 may be turned off.

At a time t5, the PLL enable signal PLLEN may transition from the low level to the high level. When the PLL enable signal PLLEN is set to the high level, the phase locked loop circuit 1000 may again be turned on.

Unlike the time t1, at the time t5, an external AFC code enable signal EXTAFC_EN may have the high level corresponding to logical high. In response to the external AFC code enable signal EXTAFC_EN of the high level, the AFC 1007 may receive the external AFC code EXTAFC from an external storage device provided outside the AFC 1007 and may generate the AFC code AFC_CODE based on the external AFC code EXTAFC. For example, after the time t3, the AFC 1007 may restore the first code CODE1 stored in the external storage device as the AFC code AFC_CODE. As such, the AFC 1007 does not have to repeatedly calibrate the AFC code AFC_CODE based on the feedback frequency signal FFDB. Accordingly, a lock time of the phase locked loop circuit 1000 may be shortened.

In the embodiment of the present disclosure illustrated in FIG. 8, the phase locked loop circuit 1000 including the LDO regulator 100a of FIG. 2A is locked at a seventh time t7. In contrast, the phase locked loop circuit 1000 including the LDO regulator 100b of FIG. 2B is locked at a sixth time t6. In other words, a lock time tLOCKwb, which is a lock time of the phase locked loop circuit 1000 including the LDO regulator 100b of FIG. 2B, may be shorter than a lock time tLOCKwa, which is a lock time of the phase locked loop circuit 1000 including the LDO regulator 100a of FIG. 2A.

In the embodiment of the present disclosure illustrated in FIG. 8, compared to when the external AFC code enable signal EXTAFC_EN is at the low level, the lock time of the phase locked loop circuit 1000 may be shortened when the external AFC code enable signal EXTAFC_EN is at the high level. In other words, when the external AFC code enable signal EXTAFC_EN is at the high level, the output frequency signal FOUT is more quickly stabilized than compared to when the external AFC code enable signal EXTAFC_EN is at the low level. The phase locked loop circuit 1000 may operate in one of the following modes: a first mode in which the external AFC code enable signal EXTAFC_EN is at the low level, and a second mode in which the external AFC code enable signal EXTAFC_EN is at the high level. The case where the external AFC code enable signal EXTAFC_EN is at the low level may be referred to as "normal booting", "cold booting", or "hard rebooting". The case where the external AFC code enable signal EXTAFC_EN is at the high level may be referred to as "warm booting" or "soft rebooting".

Each of the lock time tLOCKca and the lock time tLOCKcb may be a lock time of the phase locked loop circuit 1000 for the cold booting, and each of the lock time tLOCKwa and the lock time tLOCKwb may be a lock time of the phase locked loop circuit 1000 for the warm booting. The cold booting of the phase locked loop circuit 1000 will be more fully described with reference to FIGS. 9A and 9B. The warm booting of the phase locked loop circuit 1000 will be more fully described with reference to FIGS. 10A and 10B.

Figure 9A:
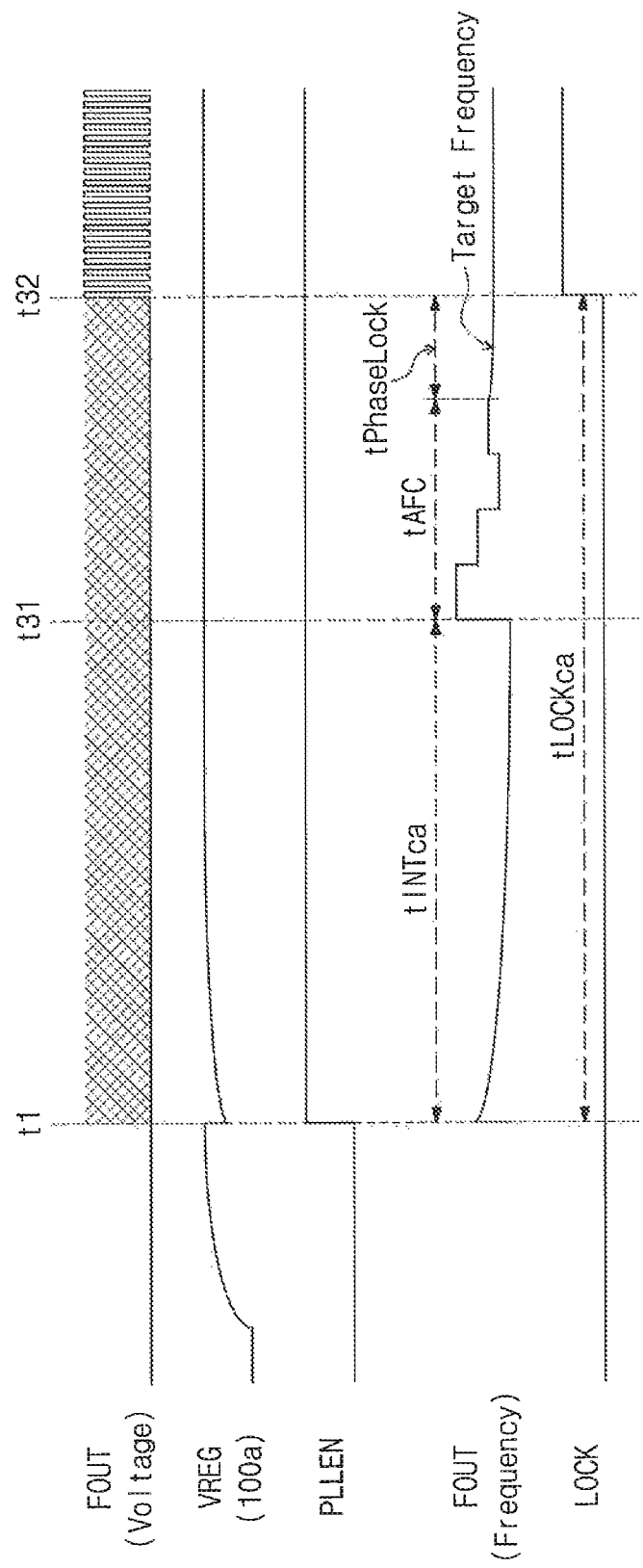
FIGS. 9A and 9B are timing diagrams of signals used in a phase locked loop circuit of FIG. 1 and voltages generated in the phase locked loop circuit, according to an embodiment of the present disclosure.
Figure 9B:
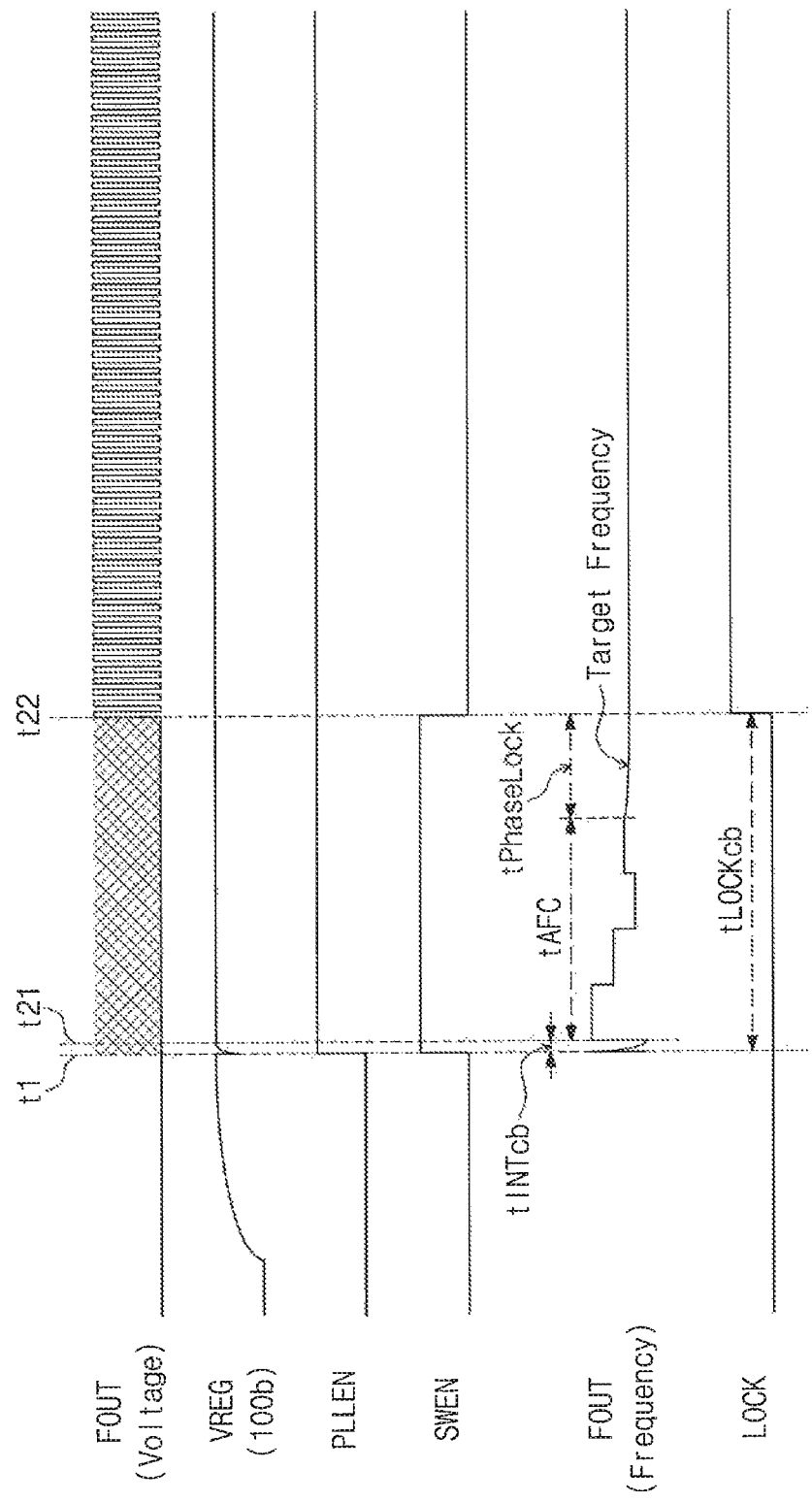

FIGS. 9A and 9B are timing diagrams of signals used in a phase locked loop circuit of FIG. 1 and voltages generated in the phase locked loop circuit, according to an embodiment of the present disclosure. A cold booting operation of the phase locked loop circuit 1000 will be more fully described by ways of example with reference to FIGS. 1, 2A, 2B, 4A, 4B, 8, 9A, and 9B.

FIG. 9A is a timing diagram associated with a cold booting operation of the phase locked loop circuit 1000 including the LDO regulator 100a of FIG. 2A. In other words, FIG. 9A is a timing diagram associated with a first booting operation of the phase locked loop circuit 1000 including the LDC regulator 100a of FIG. 2A. Before the time t1, the regulated voltage VREG that is output from the LDO regulator 100a may have a specific value. At the time t1, the phase locked loop circuit 1000 may be turned on in response to the PLL enable signal PLLEN of the high level. As such, the voltage-controlled oscillator 1005 may start to oscillate. Thus, a current of a step response may flow from the LDO regulator 100a to the voltage-controlled oscillator 1005. As a result, undershooting of the regulated voltage VREG may occur at the time t1. For example, the level of the regulated voltage VREG may drop.

The regulated voltage VREG may be stabilized at a time t31. After the regulated voltage VREG is stabilized, a frequency of the output frequency signal FOUT may be calibrated by an operation of the AFC 1007. In the vicinity of a target frequency, the AFC 1007 may determine that the frequency of the output frequency signal FOUT reaches the target frequency. For example, once the output frequency FOUT reaches the target frequency or is within a predetermined range of the target frequency, the AFC 1007 may determine that the target frequency has been met. Afterwards, a phase of the output frequency signal FOUT may be locked. At a time t32, it may be finally determined that the frequency of the output frequency signal FOUT is locked to the target frequency.

The lock time tLOCKca from the time t1 at which the PLL enable signal PLLEN transitions to the high level to the time t32 at which it is determined that the frequency of the output frequency signal FOUT is locked to the target frequency may correspond to a lock time of the phase locked loop circuit 1000 including the LDO regulator 100a of FIG. 2A in the cold booting operation. The lock time tLOCKca may include an initial booting time tINTca, an AFC time tAFC, and a phase locked time tPhaseLock. The initial booting time tINTca, the AFC time tAFC, and the phase locked time tPhaseLock may occur in sequence.

The initial booting time tINTca may be a time from when the phase locked loop circuit 1000 is turned on to when the regulated voltage VREG is stabilized. In other words, the initial booting time tINTa may be from the time t1 to the time t31. The AFC time tAFC may be a time it takes for the AFC 1007 to calibrate a frequency of the output frequency signal FOUT to be close to the target frequency. For example, the AFC time tAFC may be from the time t31 to a time prior to time t32. The phase locked time tPhaseLock may be a time it takes to lock the frequency of the output frequency signal FOUT to the target frequency. For example, the phase locked time tPhaseLock may be from the time prior to time t32 to the time t32.

FIG. 9B is a timing diagram associated with a cold booting operation of the phase locked loop circuit 1000 including the LDO regulator 100b of FIG. 2B. At the time t1, the phase locked loop circuit 1000 may be turned on in response to the PLL enable signal PLLEN of the high level. At the time t1, the switch signal SWEN may be of the high level. As such, the LDO regulator 100b may operate in the first phase Phase1. The regulated voltage VREG may be stabilized at a time t21.

At a time t22, it may be determined that the frequency of the output frequency signal FOUT is locked to the target frequency. As such, the lock signal LOCK may transition from the low level to the high level. The switch signal SWEN may transition from the high level to the low level in synchronization with the low-to-high transition of the lock signal LOCK. Accordingly, from the time t22, the LDO regulator 100b may operate in the second phase Phase2.

Because the regulated voltage VREG output from the LDO regulator 100b of FIG. 2B is stabilized more quickly than the regulated voltage VREG output from the LDO regulator 100a of FIG. 2A, an initial booting time tINTcb of FIG. 9B may be shorter than the initial booting time tINTca of FIG. 9A. Accordingly, the regulated voltage VREG may be stabilized at the time t21 preceding the time t31, the phase locked loop circuit 1000 may determine, at the time t22 preceding the time t32, that a phase is locked, and the lock time tLOCKcb may be shorter than the lock time tLOCKca.

Figure 10A:
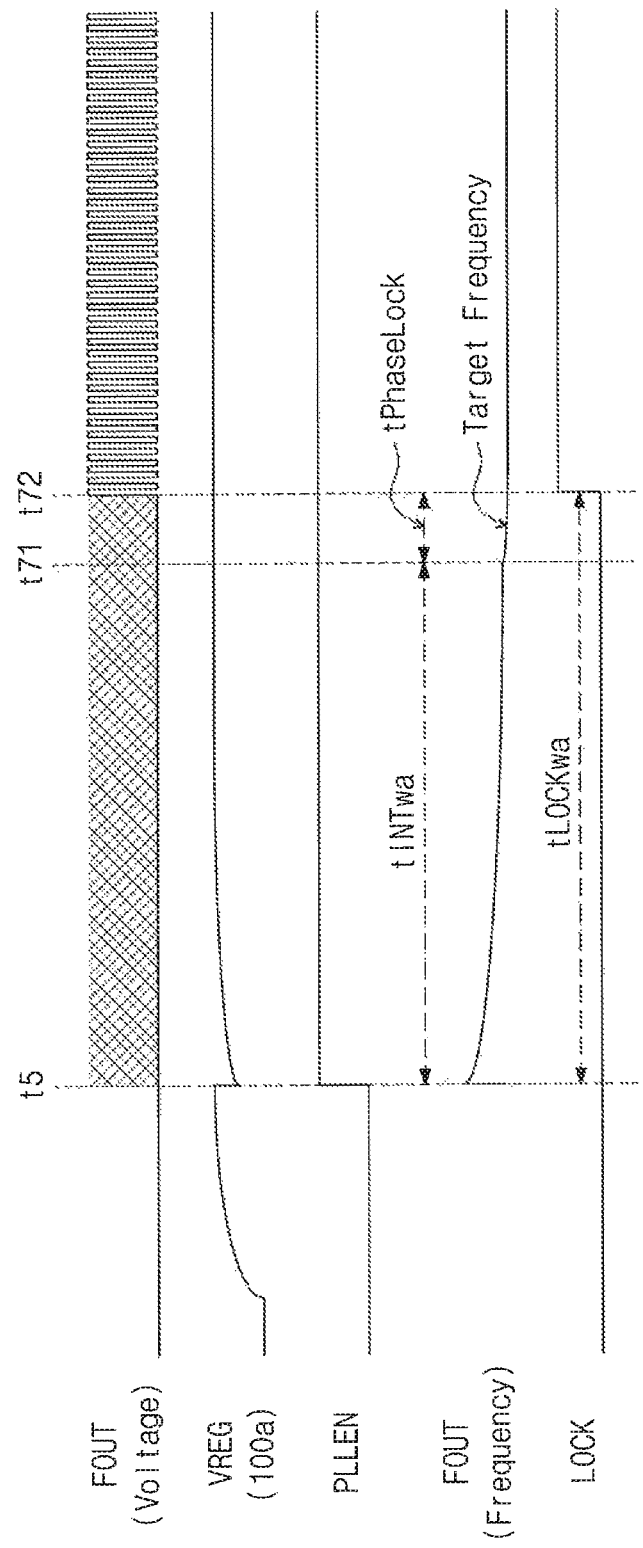
FIGS. 10A and 10B are timing diagrams of signals used in a phase locked loop circuit of FIG. 1 and voltages generated in the phase locked loop circuit, according to another embodiment of the present disclosure.
Figure 10B:
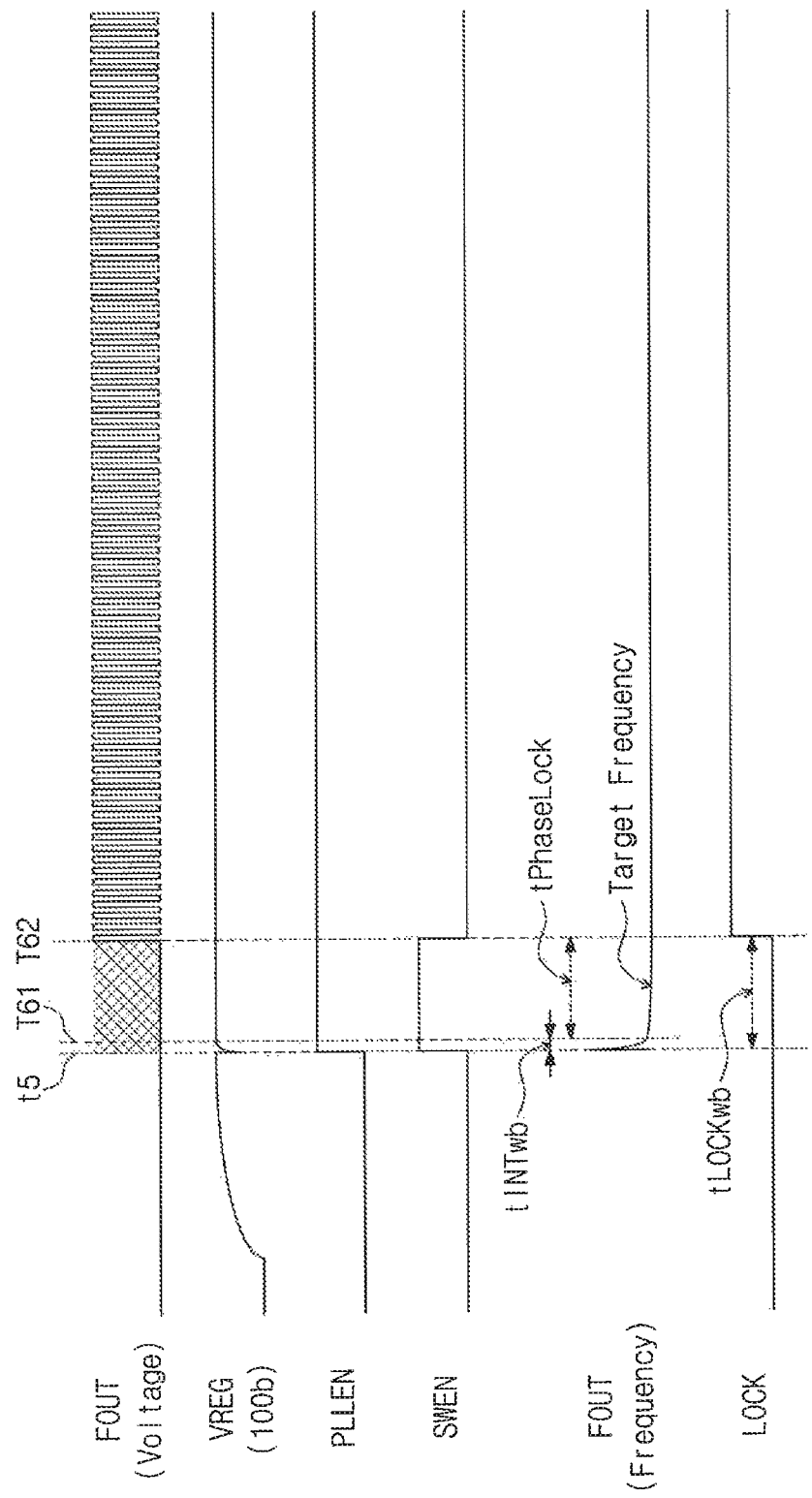

FIGS. 10A and 10B are timing diagrams of signals used in a phase locked loop circuit of FIG. 1 and voltages generated in the phase locked loop circuit, according to another embodiment of the present disclosure. A warm booting operation of the phase locked loop circuit 1000 will be more fully described by ways of example with reference to FIGS. 1, 2A, 2B, 4A, 4B, 8, 10A, and 10B.

FIG. 10A is a timing diagram associated with a warm booting operation of the phase locked loop circuit 1000 including the LDO regulator 100a of FIG. 2A. In other words, FIG. 10A is a timing diagram associated with a second booting operation of the phase locked loop circuit 1000 including the LDO regulator 100a of FIG. 2A. Before the time t5, the regulated voltage VREG that is output from the LDO regulator 100a may have a specific value. At the time t5, the phase locked loop circuit 1000 may be turned on in response to the PLL enable signal PLLEN of the high level. As such, like at the time t1 of FIG. 9A, undershooting of the regulated voltage VREG may occur at the time t5.

The regulated voltage VREG may be stabilized at a time t71. After the regulated voltage VREG is stabilized, the AFC 1007 may calibrate the frequency of the output frequency signal FOUT to be close to the target frequency almost immediately based on the external AFC code EXTAFC. Afterwards, a phase of the output frequency signal FOUT may be locked during a lock time tPhaseLock. At a time t72, it may be finally determined that the frequency of the output frequency signal FOUT is locked to the target frequency.

Unlike the cold booting operation of FIG. 9A, the lock time tLOCKwa associated with warm booting of the phase locked loop circuit 1000 including the LDO regulator 100*a* of FIG. 2A may not include the AFC time to tAFC. For example, the lock time tLOCKwa may only include the lock time tPhaseLock and an initial booting time tINTwa. Accordingly, the lock time tLOCKwa associated with warm booting of the phase locked loop circuit 1000 including the LDO regulator 100*a* of FIG. 2A may be shorter than the lock time tLOCKca associated with cold booting of the phase locked loop circuit 1000 including the LDO regulator 100*a* of FIG. 2A.

FIG. 10B is a timing diagram associated with a warm booting operation of the phase locked loop circuit 1000 including the LDO regulator 100*b* of FIG. 2B. At the time t5, the phase locked loop circuit 1000 may be turned on in response to the PLL enable signal PLLEN of the high level. At the time t5, the switch signal SWEN may be of the high level. As such, the LDO regulator 100*b* may operate in the first phase Phase1. The regulated voltage VREG may be stabilized at a time t61.

At a time t62, it may be determined that the frequency of the output frequency signal FOUT is locked to the target frequency. As such, the lock signal LOCK may transition from the low level to the high level. The switch signal SWEN may transition from the high level to the low level in synchronization with the low-to-high, transition of the lock signal LOCK. Accordingly, from the time t62, the LDO regulator 100*b* may operate in the second phase Phase2.

As in the above description given with reference to FIG. 9B, an initial booting time tINTwb of FIG. 10B may be shorter than an initial booting time tINTwa of FIG. 10A. Accordingly, the regulated voltage VREG may be stabilized at the time t61 preceding the time t71, the phase locked loop circuit 1000 may determine, at the time t62 preceding the time t72, that a phase is locked, and the lock time tLOCKwb may be shorter than the lock time tLOCKwa.

Figure 11:
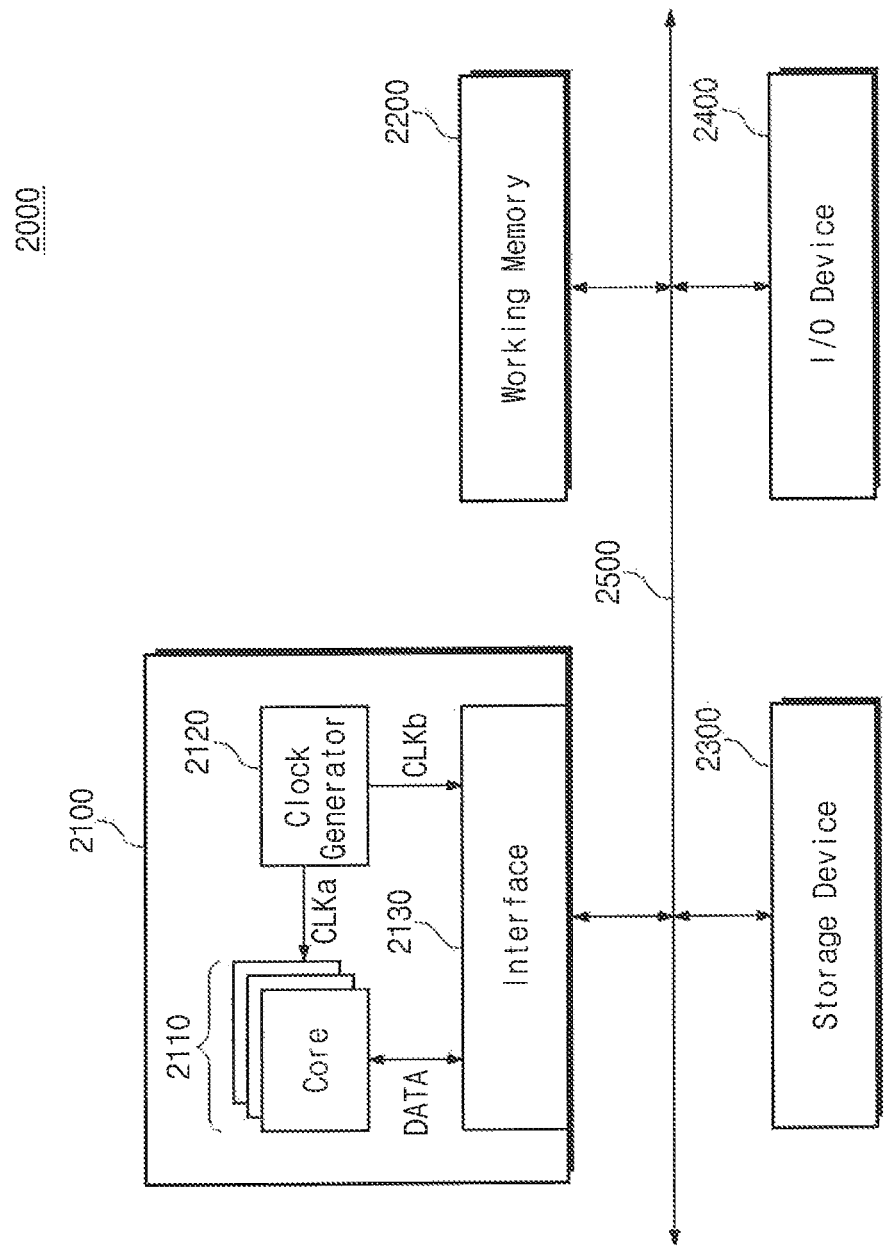
FIG. 11 is a block diagram illustrating an electronic device including a phase locked loop circuit of FIG. 1.

FIG. 11 is a block diagram illustrating an electronic device including a phase locked loop circuit of FIG. 1. Referring to FIGS. 1, 2B, and 11, the electronic device 2000 may include a processor 2100, a working memory 2200, a storage device 2300, an input/output device 2400, and a bus 2500.

The processor 2100 may include a plurality of cores 2110, a clock generator 2120, and an interface 2130. The processor 2100 may function as a central processing unit of the electronic device 2000.

The plurality of cores 2110 may perform various operations based on a clock signal CLKa applied from the clock generator 2120 and a data signal DATA received from the interface 2130. For example, each of the plurality of cores 2110 may execute an application, software, firmware, a program code, or the like stored in the storage device 2300. As another example, each of the plurality of cores 2110 may execute an operating system or various applications loaded onto the working memory 2200. Each of the plurality of cores 2110 may be implemented with a central processing unit (CPU), an image signal processing unit (ISP), a digital signal processing unit (DSP), a graphics processing unit (GPU), a vision processing unit (VPU), a neural processing unit (NPU), or the like.

The clock generator 2120 may generate the clock signal CLKa used in the plurality of cores 2110 and a clock signal CLKb used in the interface 2130. The clock generator 2120 may transmit the clock signal CLKa to the plurality of cores 2110 and may transmit the clock signal CLKb to the interface 2130.

In an embodiment of the present disclosure, the clock generator 2120 may include the phase locked loop circuit 1000 including the LDO regulator 100*b* of FIG. 2B. The clock generator 2120 may generate the clock signals CLKa and CLKb by using the phase locked loop circuit 1000. The clock generator 2120 may be turned on in response to the PLL enable signal PLLEN (refer to FIG. 8) corresponding to logical high and may be turned off in response to the PLL enable signal PLLEN corresponding to logical low.

The interface 2130 may be connected to the bus 2500. The interlace 2130 may perform communication between other components in the electronic device 2000 and the plurality of cores 2110 based on the clock signal CLKb. For example, the interlace 2130 may transmit the data signal DATA to the plurality of cores 2110 based on data received from the bus 2500. The interface 2130 may receive the data signal DATA, which includes data processed by the plurality of cores 2110, from the plurality of cores 2110. The received data signal DATA may be transmitted to the components in the electronic device 2000 through the interface 2130 and the bus 2500.

The clock signal CLKb may be used as a reference clock for generating a clock signal to be used for various protocols capable of being used by the interface 2130. In an embodiment of the present disclosure, the clock signal CLKb may be used to generate a clock signal that is required by various protocols such as PCIe (Peripheral Component Interconnect express), NVMe (Non-Volatile Memory express), SATA (Serial Advanced Technology Attachment), SCSI (Small Computer System Interface), SAS (Serial Attached SCSI), DDR (Double Data Rate), UFC (Universal Flash Storage), eMMC (Embedded Multi Media Card), and USB (Universal Serial Bus) protocols. In another embodiment of the present disclosure, the clock signal CLKb may be used to generate a clock signal to be used for communication of various protocols defined by a manufacturer, such as D2D (Die-to-Die) communication and C2C (Chip-to-Chip) communication.

The working memory 2200 may store data, which are processed or are to be processed by the processor 2100, and program codes. The working memory 2200 may function as a main memory device of the electronic device 2000. The working memory 2200 may include a static random access memory (SRAM), a dynamic random access memory (DRAM), a phase-change random access memory (PRAM), a magnetic random access memory (MRAM), a ferroelectric random access memory (FeRAM), a resistive random access memory (RRAM), or the like. The working memory 2200 may be referred to as a "buffer memory" or a "cache memory". The electronic device 2000 may include one or more working memories 2200. In addition, the working memory 2200 may be implemented as an external device capable of communicating with the electronic device 2000.

The storage device 2300 may store data regardless of whether a power is supplied. The storage device 2300 may function as an auxiliary memory device of the electronic device 2000. The storage device 2300 may include a non-volatile memory device such as a read-only memory or a solid state drive (SSD). Data stored in the storage device 2300 may be provided to the processor 2100 through the bus 2500.

The input/output device 2400 may perform communication between the electronic device 2000 and an external device of the electronic device 2000. For example, under control of the processor 2100, the input/output device 2400 may receive data from the external device of the electronic device 2000 in compliance with various wired or wireless protocols and may transmit data stored in the electronic device 2000 to the outside of the electronic device 2000.

The bus 2500 may provide a communication path between the components of the electronic device 2000. The processor 2100, the working memory 2200, the storage device 2300, and the input/output device 2400 may exchange data with each other through the bus 2500. The bus 2500 may be configured to support various communication formats that are used in the electronic device 2000. For example, the bus 2500 may be AHB (Advanced High-performance Bus), ASB (Advanced System Bus), APB (Advanced Peripheral Bus), or AXI (Advanced eXtensible Interface) that is based on the AMBA (Advanced Microcontroller Bus Architecture).

Figure 12:
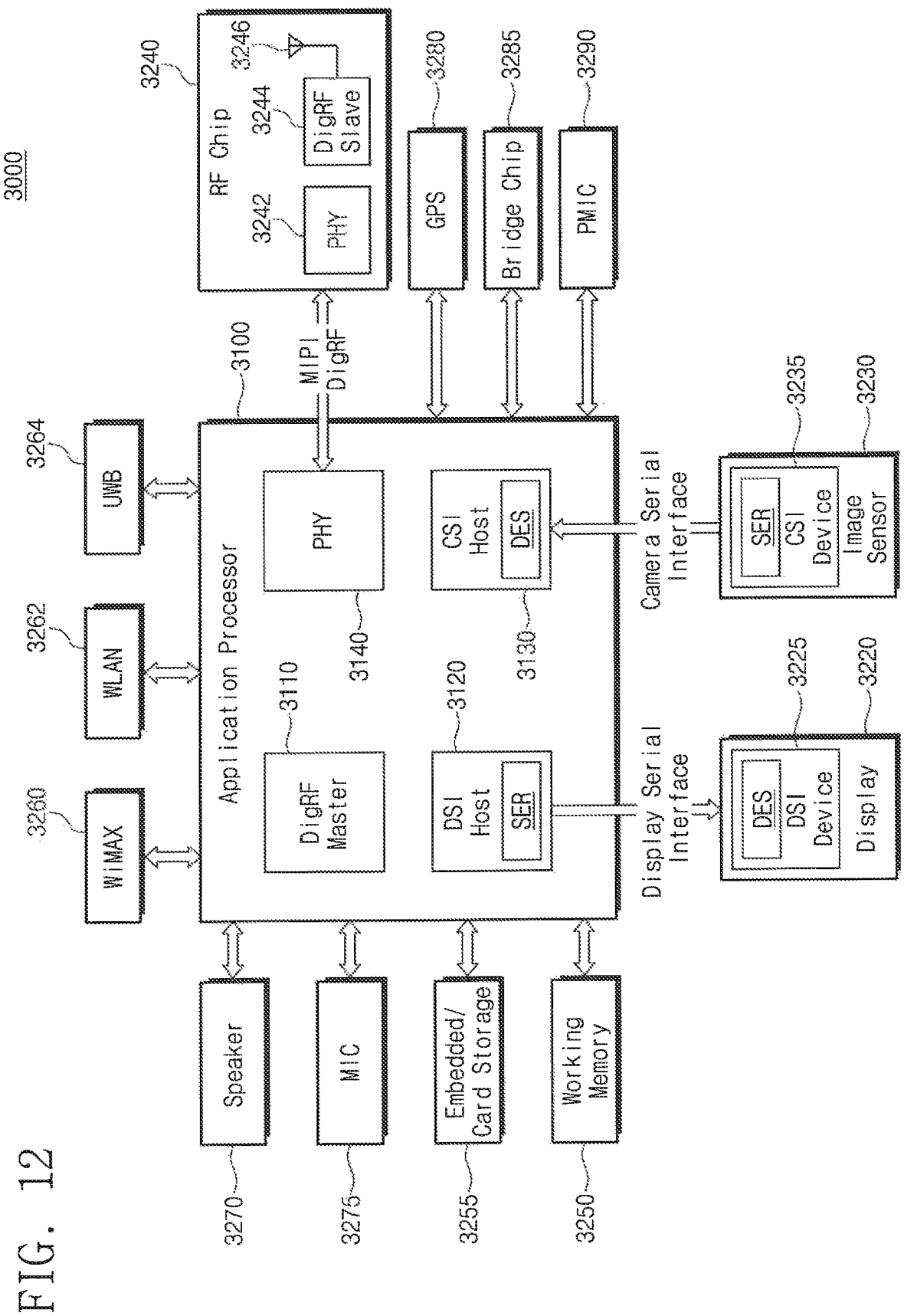
FIG. 12 is a block diagram illustrating an electronic device including a phase locked loop circuit of FIG. 1.

FIG. 12 is a block diagram illustrating an electronic device including a phase locked loop circuit of FIG. 1. An electronic device 3000 may be referred to as a "computing system", a "memory system", an "electronic system", or a "communication system". For example, the electronic device 3000 may be a desktop computer, a laptop computer, a tablet computer, a mobile device, a smartphone, a personal digital assistant (PDA), a portable multimedia player (PMP), a wearable device, a video game console, a workstation, a server, a data processing device capable of using or supporting an interface protocol set forth by the mobile industry processor interface (MIPI) alliance, home appliances, a black box, a drone, etc. The electronic device 3000 may include an application processor 3100, a display 3220, and an image sensor 3230.

In an embodiment of the present disclosure, the application processor 3100 may be implemented with a single chip. For example, the application processor 3100 may be implemented in the form of a system-on-chip (SoC).

A configuration and an operation of the application processor 3100 may be similar to those of the processor 2100 described with reference to FIG. 11. For example, the application processor 3100 may include the phase locked loop circuit 1000 including the LDO regulator 100b of FIG. 2B.

The application processor 3100 may include a DigRF master 3110, a display serial interface (DSI) host 3120, a camera serial interface (CSI) host 3130, and a physical layer 3140. The DSI host 3120 may communicate with a DSI device 3225 of the display 3220 through the DSI. For example, a serializer SER may be implemented in the DSI host 3120, and a deserializer DES may be implemented in the DST device 3225. The CSI host 3130 may communicate with a CSI device 3235 of the image sensor 3230 through a CSI. For example, a deserializer DES may be implemented in the CSI host 3130, and a serializer SER may be implemented in the CSI device 3235. The electronic device 3000 may further include a radio frequency (RF) chip 3240 that communicates with the application processor 3100. The RF chip 3240 may include a physical layer 3242, a DigRF slave 3244, and an antenna 3246. For example, the physical layer 3242 and the physical layer 3140 may exchange data with each other through a DigRF interface set forth by the MIPI alliance.

The electronic device 3000 may further include a working memory 3250 and an embedded/card storage device 3255. The working memory 3250 and the embedded/card storage device 3255 may store or output data associated with the application processor 3100. The embedded storage device 3255 may be embedded in the electronic device 3000, and the card storage device 3255 is a removable device that may be mounted in the electronic device 3000.

The electronic device 3000 may communicate with an external device/system through a communication module, such as a worldwide interoperability for microwave access (WiMAX) 3260, a wireless local area network (WLAN) 3262, or an ultra-wideband (UWB) 3264. The electronic device 3000 may further include a speaker 3270, a microphone 3275, a global positioning system (GPS) device 3280, a bridge chip 3285 and a power management integrated circuit (PMIC) 3290.

A lock time of the phase locked loop circuit 1000 in the electronic device 2000/3000 may be shortened through the LDO regulator 100b of FIG. 2B included therein. As such, a time during which the electronic device 2000/3000 waits to receive a clock signal CLK may be shortened. As a result, the power consumption efficiency of the electronic device 2000/3000 may be improved.

A capacitor that is included in a regulator circuit according to an embodiment of the present disclosure to vary a bandwidth may be connected directly or indirectly with an error amplifier depending on whether a phase of an output signal of a phase locked loop circuit is locked. As such, the regulator circuit may quickly supply a stable voltage in a time period where a phase noise characteristic is not important and may operate to satisfy a low noise characteristic in a time period where a phase noise characteristic is important.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An electronic device, comprising:
a regulator circuit configured to output a regulated voltage based on a reference voltage and a feedback voltage; and
an oscillator configured to generate an output frequency signal based on a reference frequency signal and the regulated voltage output from the regulator circuit,
wherein the regulator circuit includes:
a feedback loop configured to output the regulated voltage based on a difference between the reference voltage and the feedback voltage;
a first capacitor;
a precharge circuit connected to the feedback loop, and configured to charge the first capacitor with a second voltage which is based on a first voltage;
a first switch configured to connect the precharge circuit with the first capacitor; and
a second switch configured to connect the first capacitor with the feedback loop,
wherein the first switch connects the precharge circuit with the first capacitor in response to a first signal,
wherein the second switch connects the first capacitor with the feedback loop in response to a second signal,
wherein the precharge circuit is turned on in response to the first signal and is turned off in response to the second signal, and
wherein the first signal and the second signal are complementary.

2. The electronic device of claim 1, further comprising:
a control signal generator circuit configured to generate the first signal and the second signal based on a number of rising edges of the reference frequency signal.

3. The electronic device of claim 1, further comprising:
a lock detector circuit configured to generate a lock signal by determining whether a phase of the output frequency signal is locked; and
a control signal generator circuit configured to generate the first signal and the second signal based on the lock signal.

4. The electronic device of claim 1, wherein the electronic device is turned on in response to a third signal of logical high, and
wherein the first signal is at the logical high from when the third signal transitions from logical low to the logical high to when a phase of the output frequency signal is locked.

5. The electronic device of claim 1, wherein the precharge circuit includes:
an amplifier configured to receive the first voltage and charge the first capacitor with a portion of the first voltage.

6. An electronic device, comprising:
a regulator circuit configured to output a regulated voltage based on a reference voltage and a feedback voltage; and
an oscillator configured to generate an output frequency signal based on a reference frequency signal and the regulated voltage output from the regulator circuit,
wherein the regulator circuit includes:
a feedback loop configured to output the regulated voltage based on a difference between the reference voltage and the feedback voltage;
a first capacitor;
a precharge circuit connected to the feedback loop, and configured to charge the first capacitor with a second voltage which is based on a first voltage;
a first switch configured to connect the precharge circuit with the first capacitor; and
a second switch configured to connect the first capacitor with the feedback loop,
wherein the electronic device further includes an auto frequency calibration (AFC) circuit configured to output a first code,
wherein a frequency and a phase of the output frequency signal are calibrated based on the first code.

7. The electronic device of claim 6, wherein, in a first mode, the AFC circuit is further configured to generate the first code based on the output frequency signal, and
wherein, in a second mode, the AFC circuit is further configured to generate the first code based on an external code received from an external device.

8. A processor, comprising:
a clock generator including a regulator circuit configured to output a regulated voltage based on a reference voltage and a feedback voltage and an oscillator configured to generate a clock signal based on a reference frequency signal and the regulated voltage; and
a plurality of cores each configured to operate based on the clock signal,
wherein the regulator circuit includes:
a precharge circuit configured to charge a first capacitor with a second voltage by using a first voltage, in response to a first signal,
wherein the second voltage is based on a difference between the first voltage and a feedback voltage of the precharge circuit, and
wherein the first capacitor is connected to a first node of the regulator circuit, from which the first voltage is output, in response to a second signal,
wherein the clock generator further includes:
a control signal generator circuit configured to count a period of the reference frequency signal and to generate the first signal and the second signal based on a result of the counting, and
wherein the first signal and the second signal are complementary to each other.

9. The processor of claim 8, wherein the regulator circuit further includes:
a first switch configured to connect the precharge circuit with the first capacitor in response to the first signal; and
a second switch configured to connect the first capacitor with the first node from which the first voltage of the regulator circuit is output, in response to the second signal.

10. The processor of claim 8, wherein the clock generator further includes:
a lock detector circuit configured to determine whether a phase of the clock signal is locked and to output a lock signal based on a result of the determination, wherein the
control signal generator circuit is further configured to generate the first signal and the second signal based on the lock signal.

11. The processor of claim 8, wherein the clock generator is turned on in response to a third signal of logical high,
wherein the first signal is at the logical high from where the third signal transitions from logical low to the logical high to when a phase of the clock signal is locked.

* * * * *